(12) United States Patent
Shinohara et al.

(10) Patent No.: US 6,864,548 B2
(45) Date of Patent: Mar. 8, 2005

(54) SEMICONDUCTOR DEVICE WITH SOURCE LINE HAVING REDUCED RESISTANCE AND MANUFACTURING METHOD THEREFOR

(75) Inventors: Hirofumi Shinohara, Tokyo (JP); Tomohiro Ushio, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/167,655

(22) Filed: Jun. 13, 2002

(65) Prior Publication Data

US 2003/0141594 A1 Jul. 31, 2003

(30) Foreign Application Priority Data

Jan. 30, 2002 (JP) ........................................ 2002-021206

(51) Int. Cl.[7] .............................................. H01L 29/76
(52) U.S. Cl. ....................................... 257/390; 257/391
(58) Field of Search ................................ 257/390, 391; 438/128–130, 217, 275, 276, 278, 290, 389

(56) References Cited

U.S. PATENT DOCUMENTS 4,384,345 A * 5/1983 Mikome ...................... 365/104
4,707,718 A * 11/1987 Sakai et al. .................. 257/391

FOREIGN PATENT DOCUMENTS

| JP | 6-5877 | 1/1994 |
| JP | 6-21401 | 1/1994 |

* cited by examiner

*Primary Examiner*—Hung Vu
(74) *Attorney, Agent, or Firm*—Oblon, Spivak, McClelland, Maier & Neustadt, P.C.

(57) ABSTRACT

A semiconductor device, wherein the lowering, in comparison with a background art, of the resistance of a source line is achieved and a manufacturing method for the same are obtained.

A protruding portion (2m) that protrudes in the Y direction towards each drain region (3m) from a trunk portion (1) is formed in a source line (SLa) in each of five memory cells corresponding to "1" of the ROM code from among eight memory cells belonging to the m-th row. In the same manner, a protruding portion (2n) that protrudes in the Y direction towards each drain region (3n) from the trunk portion (1) is formed in the source line (SLa) in each of four memory cells corresponding to "1" of the ROM code from among eight memory cells belonging to the n-th row.

12 Claims, 21 Drawing Sheets

FIG. 25
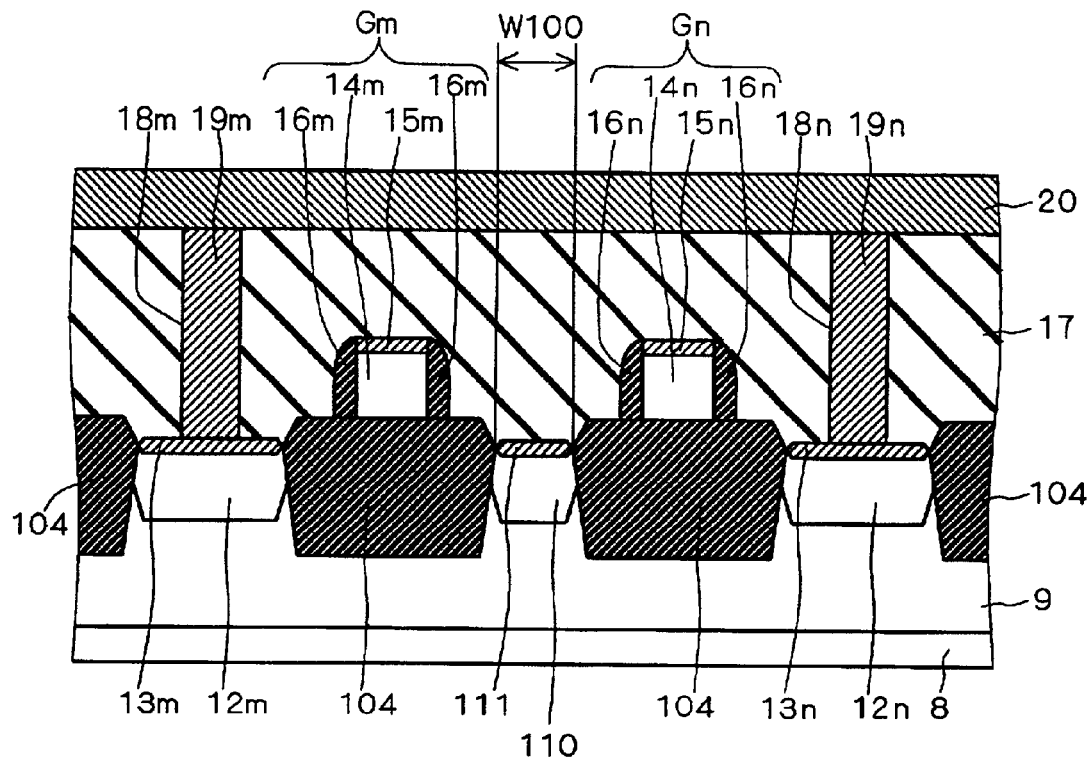
FIG. 26      (BACKGROUND ART)
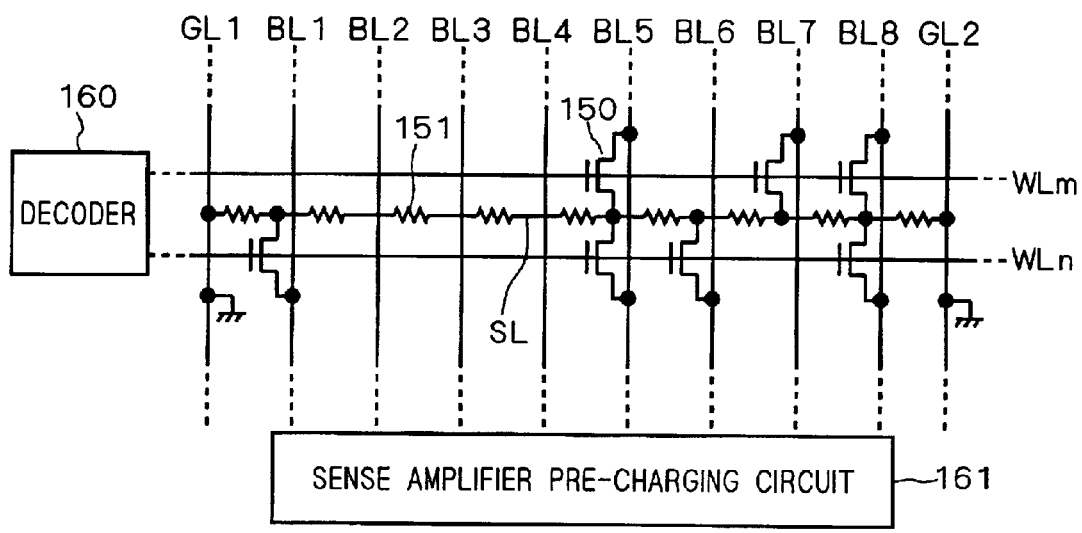

US 6,864,548 B2

SEMICONDUCTOR DEVICE WITH SOURCE LINE HAVING REDUCED RESISTANCE AND MANUFACTURING METHOD THEREFOR

BACKGROUND OF THE INVENTION

1. Field of the Invention

This invention relates to a semiconductor device and to a manufacturing method for the same, and more particularly to a structure of a mask ROM (Read Only Memory) in which programming is carried out through the patterning of an isolation insulating film and to a manufacturing method for the same.

2. Description of the Background Art

FIG. 24 is a top view showing the structure of a semiconductor device according to a background art. FIG. 24 shows a two row by eight column section of memory cells, which is a portion of a memory cell array of the mask ROM according to the background art. Word lines WLm and WLn are word lines respectively belonging to the m-th row and the n-th row. A plurality of drain regions 3m that belong to the m-th row are mutually isolated by an isolation insulating film 104 and are formed so as to be aligned in the X direction (row direction) in the figure. In the same manner, a plurality of drain regions 3n that belong to the n-th row are mutually isolated by the isolation insulating film 104 and are formed so as to be aligned in the X direction. A source line SL extends in the X direction between the word line WLm and the word line WLn. The word line WLm extends in the X direction between the plurality of drain regions 3m and the source line SL. In the same manner, the word line WLn extends in the X direction between the plurality of drain regions 3n and the source line SL.

Bit lines BL1 to BL8 are provided for each column so as to extend in the Y direction (column direction) in the figure. In addition, the bit lines BL1 to BL8 are respectively connected to the drain regions 3m via contact plugs 5m that belong the m-th row and to the drain regions 3n via contact plugs 5n that belong to the n-th row.

A ground line GL1 is provided so as to adjoin the bit line BL1 and the ground line GL1 is connected to the source line SL via a contact plug 61. In the same manner, a ground line GL2 is provided so as to adjoin the bit line BL8 and the ground line GL2 is connected to the source line SL via a contact plug 62.

Five memory cells, from among eight memory cells that belong to the m-th row, in which the isolation insulating film 104 is formed between each drain region 3m and the source line SL, are memory cells that memory cell transistors are not formed and correspond to "1" of the ROM code. On the other hand, three memory cells in which the isolation insulating film 104 is not formed between each drain region 3m and the source line SL are memory cells that memory cell transistors are formed and correspond to "0" of the ROM code.

In the same manner, four memory cells, from among eight memory cells that belong to the n-th row, in which the isolation insulating film 104 is formed between each drain region 3n and the source line SL correspond to "1" of the ROM code while four memory cells in which the isolation insulating film 104 is not formed correspond to "0" of the ROM code.

In memory cells that correspond to "1" of the ROM code, the drain regions 3m, 3n and the source line SL are isolated from each other by the isolation insulating film 104. On the other hand, in memory cells that correspond to "0" of the ROM code, the drain regions 3m, 3n and the source line SL are connected to each other via channel formation regions 7m and 7n.

In FIG. 24, the width of the source line SL with respect to the Y direction is assumed to be W100. In addition, the interval of the contact plugs 5m and 5n belonging to the same column is assumed to be L1.

FIG. 25 is a cross sectional view showing the cross sectional structure with respect to the location along line segment A100—A100 shown in FIG. 24. A P well 9 is formed in a top surface of a silicon substrate 8. In addition, the isolation insulating film 104 is formed in the top surface of the silicon substrate 8 according to a predetermined pattern. A top surface of the isolation insulating film 104 is located above the top surface of the silicon substrate 8. In addition, $N^+$-type impurity introduced regions 12m, 12n and 110 are formed in the top surface of the silicon substrate 8 in the portions that the isolation insulating film 104 is not formed. Cobalt silicide layers 13m, 13n and 111 are respectively formed on the top surface of the silicon substrate 8 in the portions that the $N^+$-type impurity introduced regions 12m, 12n and 110 are formed.

A structure Gm, that sidewalls 16m are formed on the sides of a structure having a cobalt silicide layer 15m formed on a polysilicon layer 14m, and a structure Gn, that sidewalls 16n are formed on the sides of a structure having a cobalt silicide layer 15n formed on a polysilicon layer 14n, are formed, respectively, on the isolation insulating film 104. An interlayer insulating film 17 is formed so as to cover the structures Gm, Gn, the isolation insulating film 104 and the cobalt silicide layers 13m, 13n and 111. A metal film 20 is formed on the interlayer insulating film 17. Contact holes 18m and 18n are formed in the interlayer insulating film 17 and the insides of the contact holes 18m and 18n are filled in with metal films 19m and 19n. The metal film 20 is connected to the cobalt silicide layers 13m and 13n, respectively, via the metal films 19m and 19n.

In reference to FIGS. 24 and 25, the $N^+$-type impurity introduced region 12m and the cobalt silicide layer 13m correspond to the drain region 3m, the $N^+$-type impurity introduced region 12n and the cobalt silicide layer 13n correspond to the drain region 3n and the $N^+$-type impurity introduced region 110 and the cobalt silicide layer 111 correspond to the source line SL. In addition, the structure Gm corresponds to the word line WLm, the structure Gn corresponds to the word line WLn and the metal film 20 corresponds to the bit lines BL1 to BL8. In addition, the contact hole 18m and the metal film 19m correspond to the contact plug 5m while the contact hole 18n and the metal film 19n correspond to the contact plug 5n.

Here, though two memory cell structures, both of which correspond to "1" of the ROM code, are shown in FIG. 25, the polysilicon layers 14m and 14n are formed above the silicon substrate 8 via a gate insulating film in a memory cell that corresponds to "0" of the ROM code and, thereby, memory cell transistors (NMOSFETs in the case of this example) are formed to have the structures Gm and Gn as gate electrodes.

FIG. 26 is an equivalent circuit diagram of the memory cell array shown in FIG. 24. The word lines WLm and WLn are connected to a decoder 160 while the bit lines BL1 to BL8 are connected to a sense amplifier pre-charging circuit 161. As shown in FIG. 26, memory cell transistors 150 are formed, respectively, in seven memory cells corresponding to "0" of the ROM code shown in FIG. 24.

In reference to FIG. 26, a read out operation with respect to the m-th row is described. First, in the condition that no voltage is applied to any of the word lines, a voltage is applied to the bit lines BL1 to BL8 by means of the pre-charging circuit 161 and, thereby, the bit lines BL1 to BL8 are pre-charged. Next, after the stoppage of the application of voltage to the bit lines BL1 to BL8, the word line WLm is selected by the decoder 160 and a voltage is applied to the word line WLm.

Thereby, the three memory cell transistors 150 connected to the word line WLm convert to the on condition and, therefore, the charge that has been pre-charged in the bit lines BL5, BL7 and BL8 is discharged to ground lines GL1 and GL2 via the source line SL. On the other hand, the memory cell transistors 150 are not formed in the other memory cells belonging to the m-th row and, therefore, the charge that has been pre-charged in the bit lines BL1 to BL4 and BL6 is not discharged.

Accordingly, after a predetermined period of time has elapsed since the application of voltage to the word line WLm, the potentials of the bit lines BL1 to BL8 are detected by the sense amplifier circuit 161 and, thereby, each ROM code of the eight memory cells belonging to the m-th row can be determined to be either "0" or "1."

The above described conventional semiconductor device, however, has the following problems.

First Problem

In reference to FIG. 26, a source resistor 151 exists in the source line SL. When the value of the source resistor 151 is great, the voltage drop, which is the product of the on current of the memory cell transistor 150 and the resistance of the source register 151, becomes great at the time of the read out operation. As a result, the efficiency of the discharge becomes poor so that the period of time required for the read out operation increases. In addition, in the case that a synchronous-type sense amplifier or the like is utilized, the ROM code may be mistakenly read out when the detection operation of the sense amplifier is started in the condition where the pre-charged charge is insufficiently discharged. Accordingly, it is desirable for the value of the source resistor 151 to be small.

In the conventional semiconductor device, however, in reference to FIG. 24, the form of the source line SL is a line having a constant width W100. Therefore, when the memory cells of which the ROM code is "1" are sequentially formed, there is a problem that the resistance of the source resistors 151 in that portion becomes comparatively great.

Second Problem

In reference to FIG. 25, in the conventional semiconductor device, the cobalt silicide layer 111 is formed on the N$^+$-type impurity introduced region 110 in order to achieve the lowering of the resistance of the source line SL. This cobalt silicide layer 111 is formed by depositing a cobalt film on the entire surface by means of a sputtering method and by, subsequently, carrying out a heat treatment after the formation of the isolation insulating film 104, the polysilicon layers 14m and 14n, the sidewalls 16m and 16n and the N$^+$-type impurity introduced region 110 in this order.

In the conventional semiconductor device and in a manufacturing method for the same, however, the difference in elevation between the top surface of the N$^+$-type impurity introduced region 110 and the top surface of the polysilicon layers 14m and 14n is comparatively great due to the film thickness of the isolation insulating film 104 in the portions formed above the top surface of the silicon substrate 8 and due to the film thickness of the polysilicon layers 14m and 14n. Therefore, at the time when a cobalt film is formed by means of the sputtering method, the film thickness of the cobalt film that is deposited on the top surface of the N$^+$-type impurity introduced region 110 becomes thinner and, as a result, the film thickness of the cobalt silicide layer 111 also becomes thinner and there is a problem that the resistance of the source resistors 151 increases.

SUMMARY OF THE INVENTION

The present invention is provided so as to solve these problems and an object thereof is to obtain a semiconductor device and a manufacturing method for the same that, in contrast to the conventional art, the lowering of the resistance of the source lines is achieved.

A semiconductor device according to a first aspect of this invention includes a plurality of first impurity introduced regions, a second impurity introduced region, and a first control electrode. The plurality of first impurity introduced regions are isolated from each other by an isolation insulating film and are aligned in a predetermined direction. The second impurity introduced region extends in the predetermined direction and is located at a distance away from the plurality of first impurity introduced regions. The first control electrode extends in the predetermined direction between the plurality of first impurity introduced regions and the second impurity introduced region. Whether a first transistor is not, or is, formed is selected for each cell depending on whether the isolation insulating film is formed or a first semiconductor region is formed due to the absence of the formation of the isolation insulating film between the first impurity introduced regions and the second impurity introduced region. A first protruding portion that protrudes towards one of the first impurity introduced regions is formed in the second impurity introduced region in a cell, wherein a first transistor is not formed, from among a plurality of cells having the first impurity introduced regions.

The width of the second impurity introduced region is increased due to the formation of a first protruding portion and, therefore, the lowering of the resistance in the second impurity introduced region can be achieved in comparison with a semiconductor device wherein a first protruding portion is not formed.

A semiconductor device according to a second aspect of this invention includes a plurality of first impurity introduced regions, a second impurity introduced region, a control electrode, a semiconductor substrate and a metal-semiconductor compound layer. The plurality of first impurity introduced regions are isolated from each other by an isolation insulating film and are aligned in a predetermined direction. The second impurity introduced region extends in the predetermined direction and is located at a distance away from the plurality of first impurity introduced regions. The control electrode extends in the predetermined direction between the plurality of first impurity introduced regions and the second impurity introduced region. The semiconductor substrate has a main surface in which the isolation insulating film and the second impurity introduced region are formed. The metal-semiconductor compound layer is formed on the main surface in a portion that the second impurity introduced region is formed. An edge portion of the control electrode on the first impurity introduced regions side is formed on the isolation insulating film while an edge portion of the control electrode on the second impurity introduced region side is formed above the main surface in a region between cells adjoining each other.

In comparison with the case where the control electrode is formed entirely above the isolation insulating film, the difference in elevation between the main surface of the semiconductor substrate and the top surface of the control electrode becomes small in an edge portion of the control electrode on the second impurity introduced region side. Therefore, the metal-semiconductor compound layer can be stably formed on the second impurity introduced region.

A semiconductor device according to a third aspect of this invention includes a plurality of first impurity introduced regions, a second impurity introduced region, a control electrode, a semiconductor substrate and a metal-semiconductor compound layer. The plurality of first impurity introduced regions are isolated from each other by an isolation insulating film and are aligned in a predetermined direction. The second impurity introduced region extends in the predetermined direction and is located at a distance away from the plurality of first impurity introduced regions. The control electrode extends in the predetermined direction between the plurality of first impurity introduced regions and the second impurity introduced region. The semiconductor substrate has a main surface in which the isolation insulating film and the first impurity introduced regions are formed. The metal-semiconductor compound layer is formed on the main surface in portions in which the first impurity introduced regions are formed. An edge portion of the control electrode on the first impurity introduced regions side is formed above the main surface in the first impurity introduced regions while an edge portion of the control electrode on the second impurity introduced region side is formed on the isolation insulating film.

In comparison with the case where the control electrode is formed entirely above the isolation insulating film, the difference in elevation between the main surface of the semiconductor substrate and the top surface of the control electrode becomes small in an edge portion of the control electrode on the first impurity introduced regions side. Therefore, the metal-semiconductor compound layer can be stably formed on the first impurity introduced regions.

These and other objects, features, aspects and advantages of the present invention will become more apparent from the following detailed description of the present invention when taken in conjunction with the accompanying drawings.

BRIEF DESCRIPTION OF THE DRAWINGS

FIG. 25 is a cross sectional view showing the cross sectional structure with respect to the location along ling segment A100—A100 shown in FIG. 24; and FIG. 26 is an equivalent circuit diagram of a memory cell array shown in FIG. 24.

DESCRIPTION OF THE PREFERRED EMBODIMENTS

First Embodiment

Figure 1:
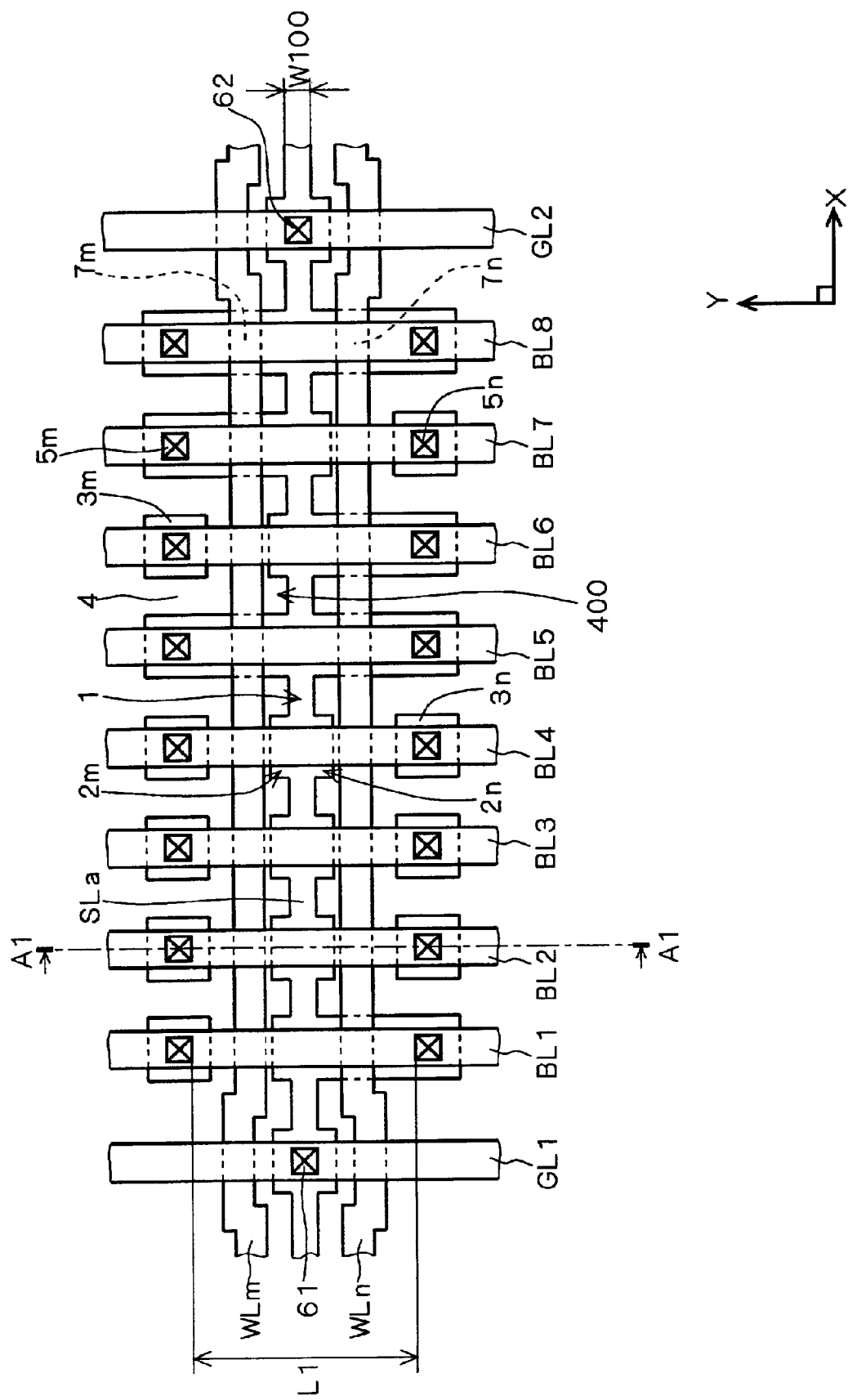
FIG. 1 is a top view showing the configuration of a semiconductor device according to a first embodiment of the present invention.

FIG. 1 is a top view showing the structure of a semiconductor device according to a first embodiment of the present invention. FIG. 1 shows, only, a two row by eight column section of memory cells, which is a portion of a memory cell array of the mask ROM wherein programming is carried out according to the patterning of the isolation insulating film. Word lines WLm and WLn, respectively, are word lines belonging to the m-th row and to the n-th row adjoining each other. A plurality of drain regions 3m belonging to the m-th row are isolated from each other by an isolation insulating film 4 and are formed so as to be aligned in the X direction (row direction) in the figure. In the same manner, a plurality of drain regions 3n belonging to the n-th row are isolated from each other by the isolation insulating film 4 and are formed so as to be aligned in the X direction. The drain region 3m or 3n is provided in respective memory cells.

A trunk portion 1 of a source line SLa shared by the m-th row and the n-th row extends in the X direction between the word line WLm and the word line WLn. The word line WLm extends in the X direction between the plurality of drain regions 3m and the source line SLa. In the same manner, the word line WLn extends in the X direction between the plurality of drain regions 3n and the source line SLa.

Bit lines BL1 to BL8 are provided for respective columns and extend in the Y direction (column direction) in the figure. In addition, the bit lines BL1 to BL8, respectively, are connected to the drain regions 3m via contact plugs 5m belonging to the m-th row and to the drain regions 3n via contact plugs 5n belonging to the n-th row. The drain regions 3m and the contact plugs 5m may be shared by the m-th row and a row adjoining the m-th row on the side opposite to the n-th row. In the same manner, the drain regions 3n and the contact plugs 5n may be shared by the n-th row and a row adjoining the n-th row on the side opposite to the m-th row.

A ground line GL1 is provided on the side opposite to the bit line BL2 so as to adjoin the bit line BL1. The ground line GL1 is connected with the source line SLa via a contact plug 61. In the same manner, a ground line GL2 is provided on the side opposite to the bit line BL7 so as to adjoin the bit line BL8. The ground line GL2 is connected to the source line SLa via a contact plug 62.

Five memory cells (memory cells corresponding to the bit lines BL1 to BL4 and BL6), from among eight memory cells belonging to the m-th row, in which the isolation insulating film 4 is formed between each drain region 3m and the source line SLa, are memory cells that memory cell transistors are not formed and correspond to "1" of the ROM code. On the other hand, three memory cells (memory cells corresponding to the bit lines BL5, BL7 and BL8) in which the isolation insulating film 4 is not formed between each drain region 3m and the source line SLa are memory cells that memory cell transistors are formed and correspond to "0" of the ROM code.

In the same manner, four memory cells (memory cells corresponding to the bit lines BL2 to BL4 and BL7), from among eight memory cells belonging to the n-th row, in which the isolation insulating film 4 is formed between each drain region 3n and the source line SLa, correspond to "1" of the ROM code while four memory cells (memory cells corresponding to the bit lines BL1, BL5, BL6 and BL8) in which the isolation insulating film 4 is not formed correspond to "0" of the ROM code.

In a memory cell corresponding to "1" of the ROM code, the drain regions 3m and 3n and the source line SLa are isolated from each other by the isolation insulating film 4. On the other hand, in a memory cell corresponding to "0" of the ROM code, the drain regions 3m and 3n and the source line SLa are connected to each other via channel formation regions 7m and 7n.

Figure 24:
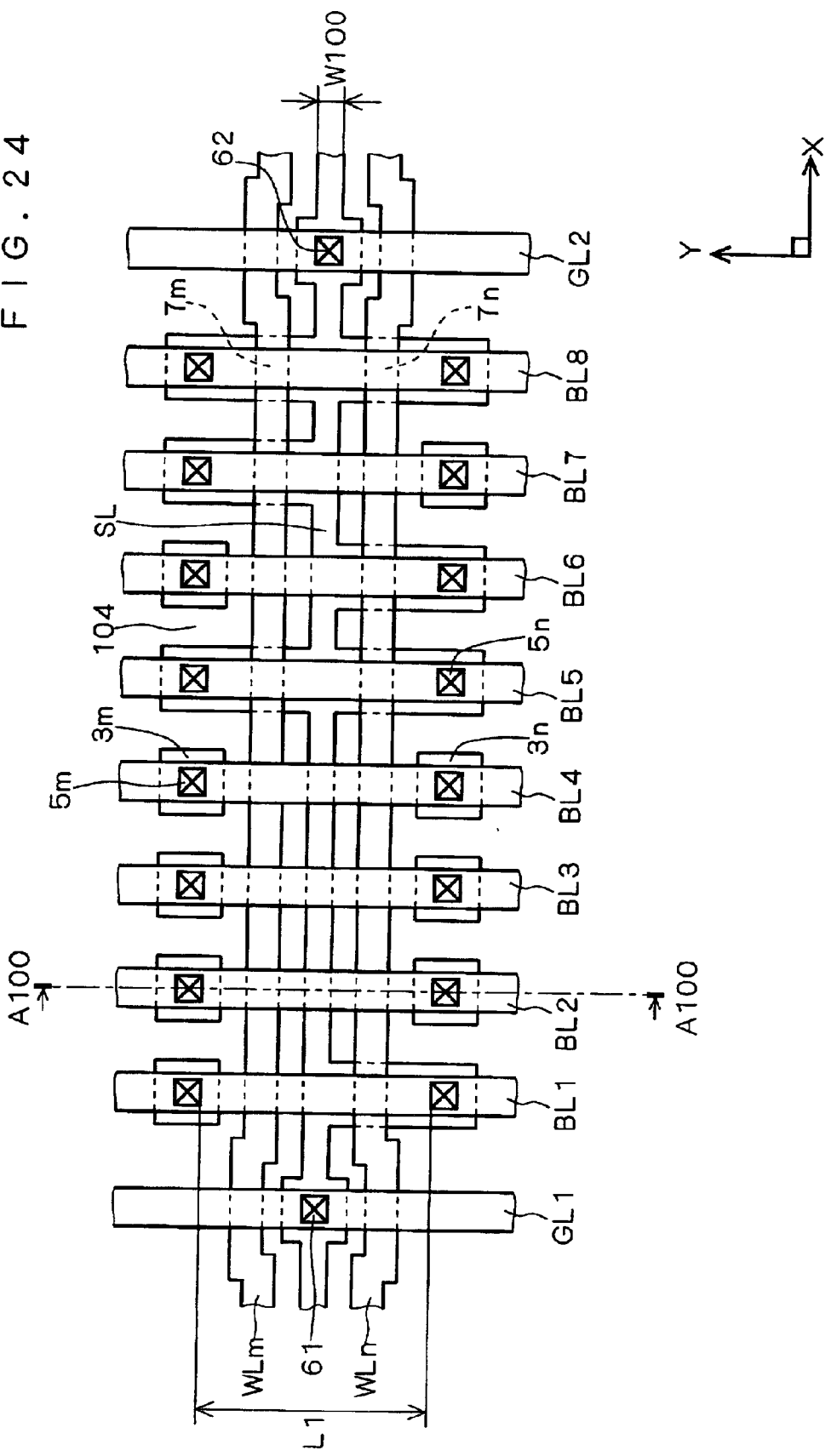
FIG. 24 is a top view showing the structure of a semiconductor device according to a background art.

The width of the trunk portion 1 of the source line SLa with respect to the Y direction is equal to the width W100 shown in FIG. 24. In addition, the interval between the contact plugs 5m and 5n belonging to the same column is the same as the interval L1 shown in FIG. 24.

In each of the five memory cells corresponding to "1" of the ROM code, from among the eight memory cells belonging to the m-th row, a protruding portion 2m that protrudes in the Y direction towards each drain region 3m from the trunk portion 1 is formed in the source line SLa. In the same manner, in each of the four memory cells corresponding to "1" of the ROM code from among the eight memory cells belonging to the n-th row, a protruding portion 2n that protrudes in the Y direction towards each drain region 3n from the trunk portion 1 is formed in the source line SLa. In the plan view, the protruding portion 2m is not overlapped with the word line WLm while the protruding portion 2n is not overlapped with the word line WLn.

Figure 2:
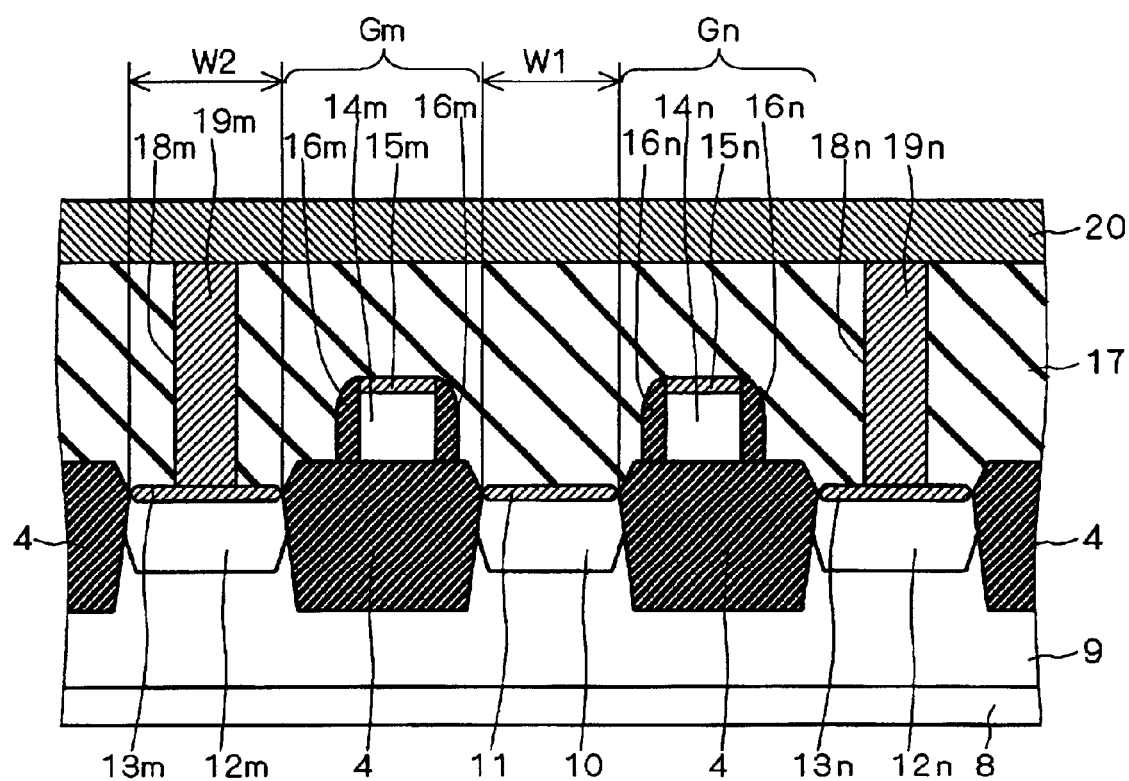
FIG. 2 is a cross sectional view showing the cross sectional structure with respect to the location along line segment A1—A1 shown in FIG. 1.
Figure 3:
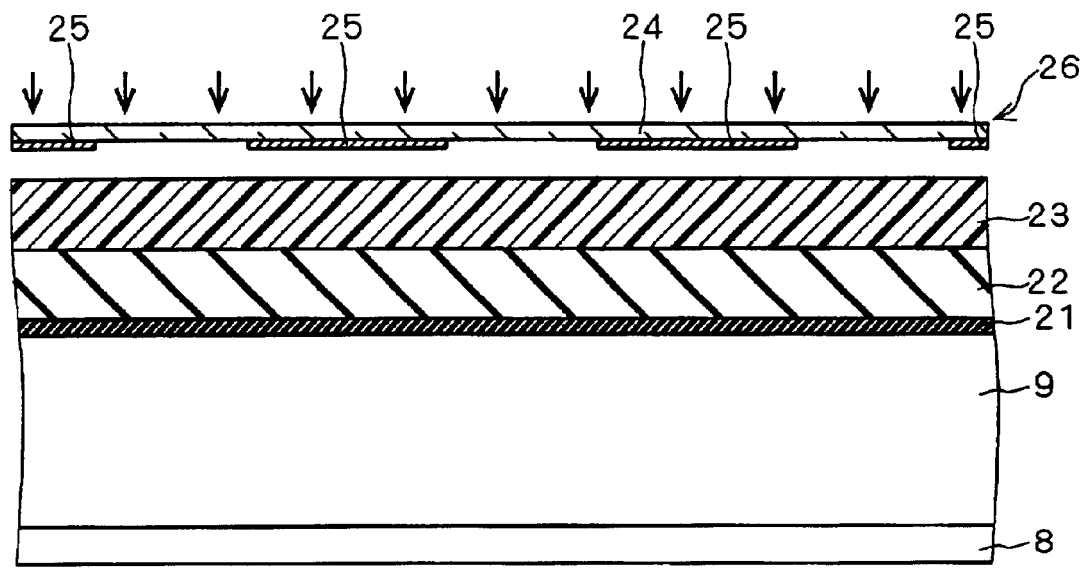
FIGS. 3 to 8 are cross sectional views showing a subsequent step of a manufacturing method for the semiconductor device according to the first embodiment of the present invention.

FIG. 2 is a cross sectional view showing the cross sectional structure with respect to the location along line segment A1—A1 shown in FIG. 1. A P well 9 is formed in a top surface of an N-type silicon substrate 8. In addition, the isolation insulating film 4, such as a LOCOS (LOCal Oxidation of Silicon) film or an STI (Shallow Trench Isolation) film, is formed according to a well-known technology to have a predetermined pattern in the top surface of the silicon substrate 8. A top surface of the isolation insulating film 4 is located above the top surface of the silicon substrate 8 due to reasons related to the manufacturing process.

$N^+$-type impurity introduced regions 12m, 12n and 10 are formed in the top surface of the silicon substrate 8 in the portions wherein the isolation insulating film 4 is not formed. Cobalt silicide layers 13m, 13n and 11 are, respectively, formed on the top surface of the silicon substrate 8 in the portions wherein $N^+$-type impurity introduced regions 12m, 12n and 10 are formed. Width W1 of the cobalt silicide layer 11 is wider than width W100 shown in FIG. 1 due to the formation of protruding portions 2m and 2n.

A structure Gm, wherein sidewalls 16m are formed on the sides of a layered structure having a cobalt silicide layer 15m formed on a polysilicon layer 14m, and a structure Gn, wherein sidewalls 16n are formed on the sides of a layered structure having a cobalt silicide layer 15n formed on a polysilicon layer 14n, are, respectively, formed on the isolation insulating film 4. An interlayer insulating film 17 is formed so as to cover the structures Gm and Gn, the isolation insulating film 4 and the cobalt silicide layers 13m, 13n and 11. A metal film 20 is formed on the interlayer insulating film 17. Contact holes 18m and 18n are formed in the interlayer insulating film 17 and the insides of the contact holes 18m and 18n are, respectively, filled in with metal films 19m and 19n. The metal film 20 is connected to the cobalt silicide layers 13m and 13n, respectively, via the metal films 19m and 19n.

In reference to FIGS. 1 and 2, the $N^+$-type impurity introduced region 12m and the cobalt silicide layer 13m correspond to the drain region 3m, the $N^+$-type impurity introduced region 12n and the cobalt silicide layer 13n correspond to the drain region 3n and the $N^+$-type impurity introduced region 10 and the cobalt silicide layer 11 correspond to the source line SLa. In addition, the structure Gm corresponds to the word line WLm, the structure Gn corresponds to the word line WLn and the metal film 20 corresponds to the bit lines BL1 to BL8. In addition, the contact hole 18m and the metal film 19m correspond to the contact plug 5m while the contact hole 18n and the metal film 19n correspond to the contact plug 5n.

Here, though two memory cell structures, both of which correspond to "1" of the ROM code, are shown in FIG. 2, the polysilicon layers 14m and 14n are formed above the silicon substrate 8 via a gate insulating film in memory cells corresponding to "0" of the ROM code and, thereby, memory cell transistors (NMOSFETs in the case of this example) are formed to have structures Gm and Gn as gate electrodes.

FIGS. 3 to 8 are cross sectional views showing, following the order of the steps, a manufacturing method for the semiconductor device shown in FIG. 2. In reference to FIG. 3, first, the silicon substrate 8 is prepared and, after that, the P well 9 is formed in the top surface of the silicon substrate 8. Next, a silicon oxide film 21, a silicon nitride film 22 and a negative-type photoresist 23 are formed, in this order, over the entirety of the top surface of the silicon substrate 8. Next, the photoresist 23 is exposed by using a photomask 26 wherein a predetermined light blocking pattern 25 is formed on a glass substrate 24.

Figure 9:
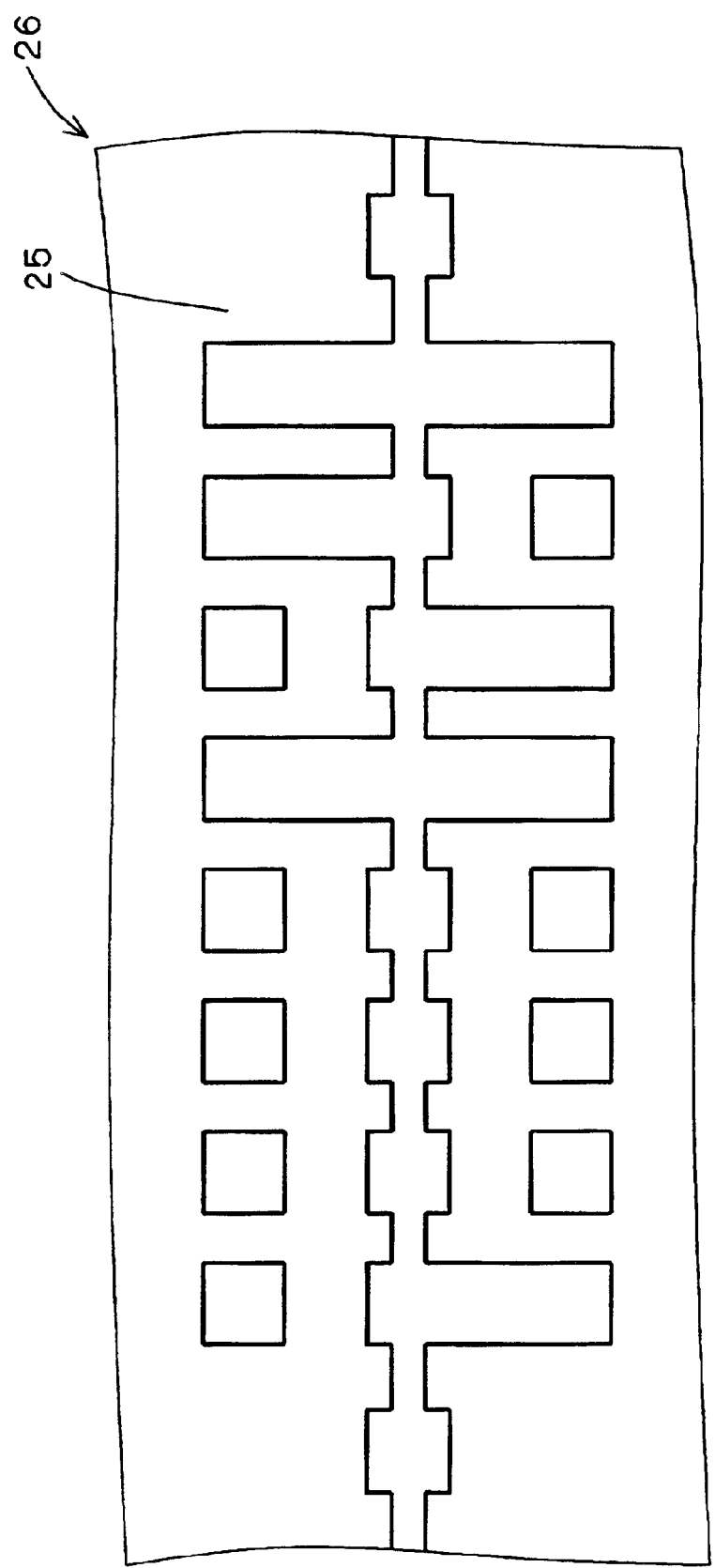
FIG. 9 is a top view showing the structure of a photomask.

FIG. 9 is a top view showing a structure of the photomask 26. As can be seen by comparing FIG. 1 with FIG. 9, the light blocking pattern 25 of the photomask 26 corresponds to a designed pattern of the isolation insulating film 4.

Figure 4:
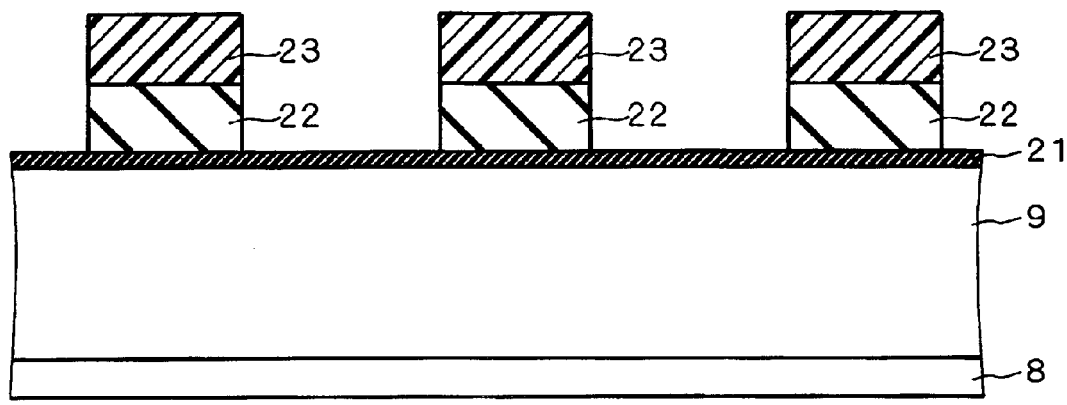

In reference to FIG. 4, next, the photoresist 23 is developed. Next, the remaining photoresist 23 is used as an etching mask so as to remove the silicon nitride film 22 until the silicon oxide film 21 is exposed by means of an anisotropic dry etching method.

Figure 5:
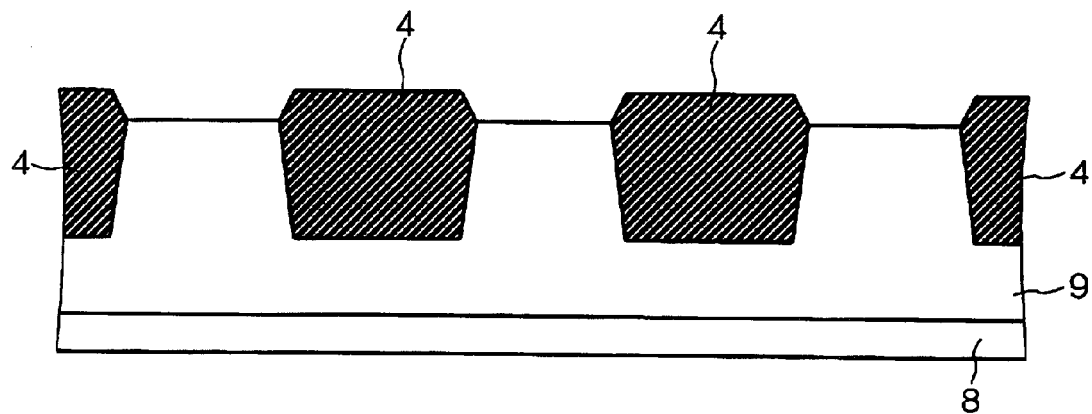

In reference to FIG. 5, next, thermal oxidation is carried out after the removal of the photoresist 23. Next, the silicon oxide film 21 in the portions that have become bases of the silicon nitride film 23 is removed after the removal of the silicon nitride film 22. Thereby, the isolation insulating film 4 is formed.

Figure 6:
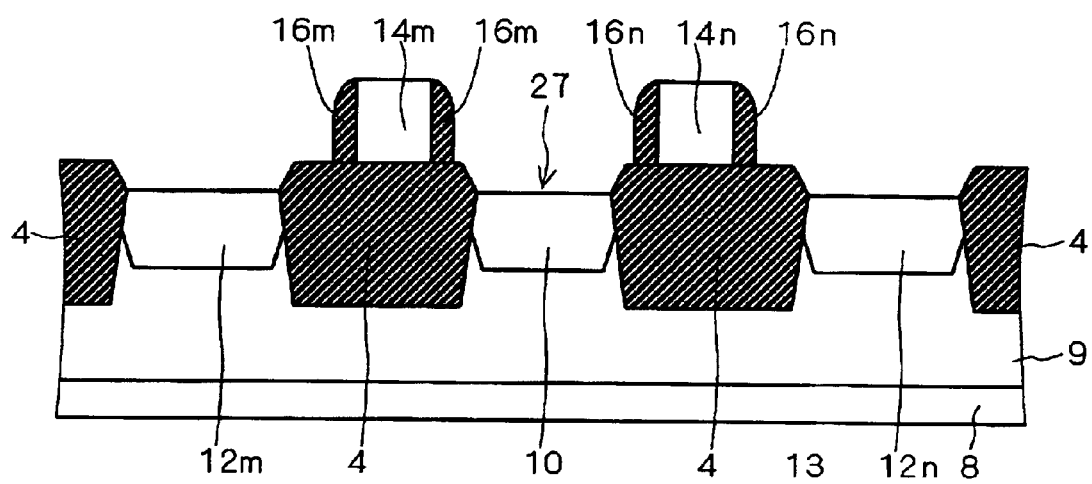

Next, after carrying out thermal oxidation in order to form a gate insulating film, in reference to FIG. 6, the polysilicon layers 14m and 14n are formed by means of a CVD method, a photomechanical method and an anisotropic dry etching method. Next, the sidewalls 16m and 16n made of a silicon oxide film are, respectively, formed on the sides of the polysilicon layers 14m and 14n by means of a CVD method and an anisotropic dry etching method. Next, the isolation insulating film 4, the polysilicon layers 14m and 14n and the sidewalls 16m and 16n are used as an implantation mask so that the $N^+$-type impurity introduced regions 12m, 12n and 10 are formed within the top surface of the silicon substrate 8 by means of an ion implantation method. A recess 27 having sides defined by the isolation insulating film 4 and the sidewalls 16m and 16n as well as a bottom defined by the top surface of the silicon substrate 8 is formed above the $N^+$-type impurity introduced region 10.

Figure 7:
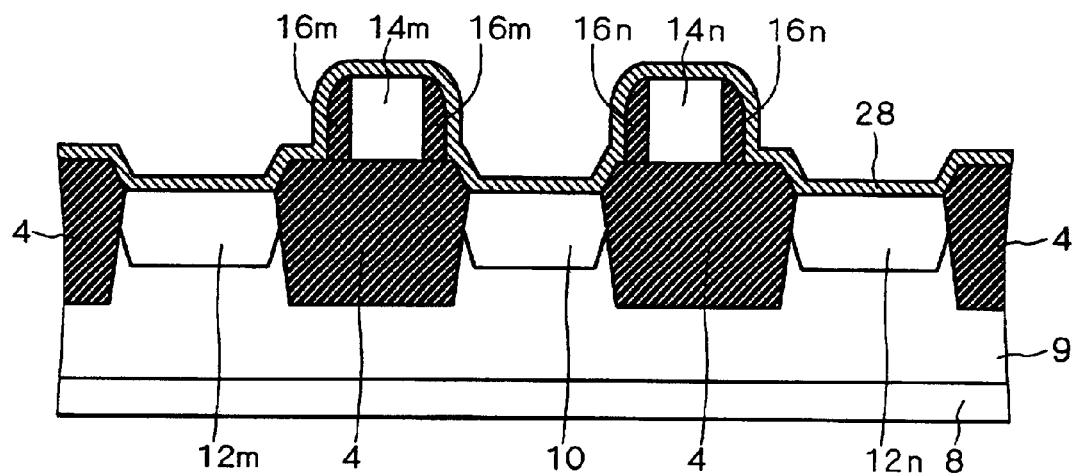
Figure 8:
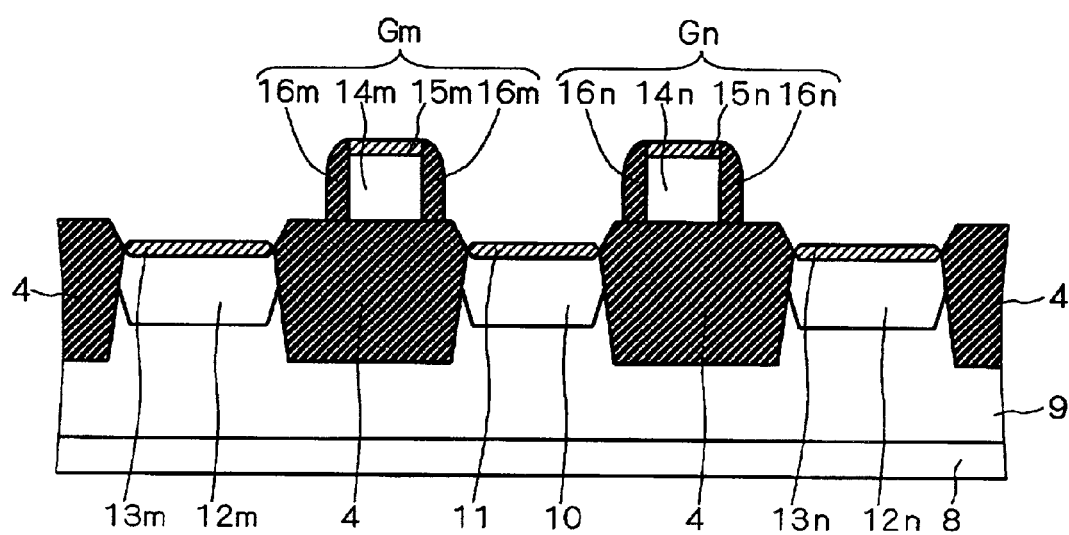

In reference to FIG. 7, next, a cobalt film 28 is formed over the entire surface by means of a sputtering method. In reference to FIG. 8, next, a heat treatment is carried out. Thereby, each of the top surfaces of the $N^+$-type impurity introduced regions 12m, 12n and 10 and each of the top surfaces of the polysilicon layers 14m and 14n are converted to silicide so that the cobalt silicide layers 13m, 13n, 11, 15m and 15n are, respectively, formed. After that, unreacted cobalt film 28 is removed.

After that, the interlayer insulating film 17, the contact holes 18m and 18n, the metal films 19m and 19n as well as the metal film 20 are formed, in this order, according to well-known wire formation steps and, thereby, the structure shown in FIG. 2 is obtained.

Thus, in accordance with a semiconductor device and a manufacturing method for the same according to the present first embodiment, as shown in FIG. 1, the protruding portions 2m and 2n are formed in the source line SLa. Therefore, in comparison with the conventional semiconductor device shown in FIG. 24, lowering of the resistance in the source line SLa can be achieved.

In addition, as shown in FIG. 1, a protruding portion 400 of the isolation insulating film 4 is formed between memory cells adjoining each other in the X direction. Therefore, insulation between memory cells adjoining each other can be secured at the same level as in the conventional semiconductor device.

Second Embodiment

Figure 10:
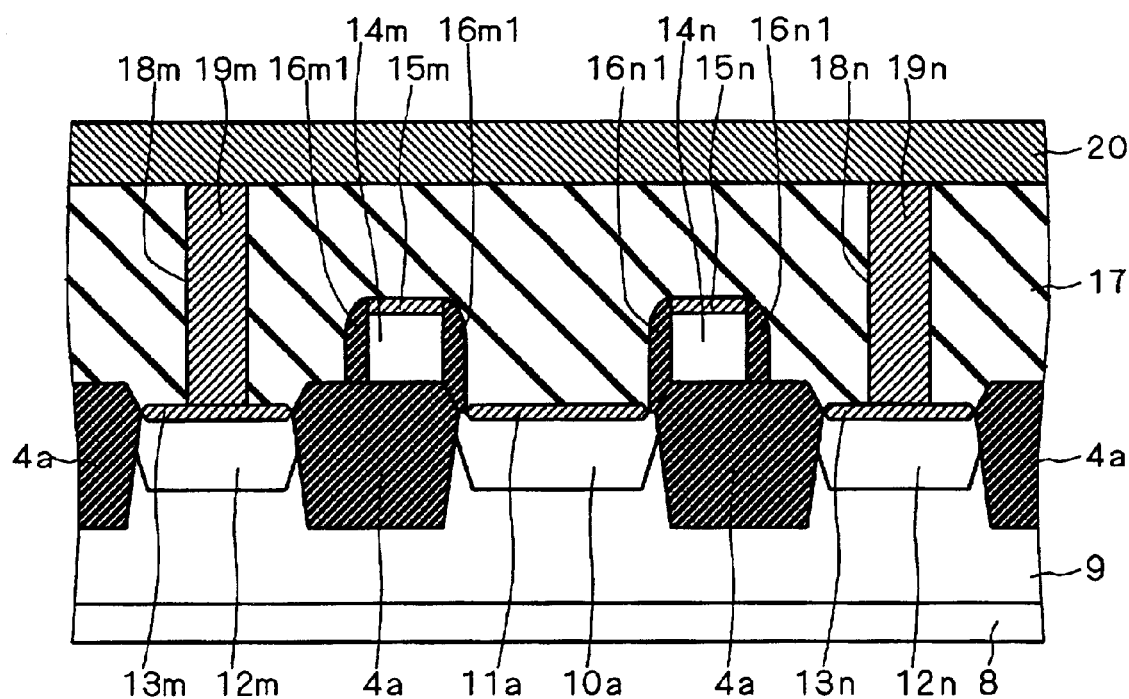
FIG. 10 is a cross sectional view showing the structure of a semiconductor device according to a second embodiment of the present invention.

FIG. 10, which corresponds to FIG. 2, is a cross sectional view showing the structure of a semiconductor device according to a second embodiment of the present invention. An isolation insulating film 4a, an $N^+$-type impurity introduced region 10a, a cobalt silicide layer 11a and sidewalls 16m1 and 16n1, respectively, are formed in place of the isolation insulating film 4, the $N^+$-type impurity introduced region 10, the cobalt silicide layer 11 and the sidewalls 16m and 16n shown in FIG. 2. The other parts of the structure are the same as in the structure of the above described semiconductor device according to the first embodiment.

The interval between the sides of the isolation insulating film 4a opposed to each other with the $N^+$-type impurity introduced region 10 interposed between them is broader than the interval between the sides of the isolation insulating film 4 opposed to each other with the $N^+$-type impurity introduced region 10 interposed between them. The width of the $N^+$-type impurity introduced region 10a is greater than the width of the $N^+$-type impurity introduced region 10 and the width of the cobalt silicide layer 11a is greater than the width of the cobalt silicide layer 11. That is to say, the degree of protrusion of the protruding portions 2m and 2n in the present second embodiment is greater than in the above described first embodiment.

The respective edge portions of the sidewalls 16m1 and 16n1 on sides opposed to each other with the cobalt silicide layer 11a interposed between them are not formed on the isolation insulating film 4a but, rather, are formed above the silicon substrate 8. The two edge portions of the cobalt silicide layer 11a are not defined by the isolation insulating film 4a but, rather, are defined by the sidewalls 16m1 and 16n1. In the plan view (that is to say, as viewed from the top side of the metal film 20 in FIG. 10) the sidewalls 16m1 and 16n1 are partially overlapped with the $N^+$-type impurity introduced region 10a.

The semiconductor device according to the present second embodiment can be modified by allowing the light blocking pattern 25 of the photomask 26 shown in FIG. 9 to correspond to a design pattern of the isolation insulating film 4a and, thereby, can be manufactured by the same method as the manufacturing method for a semiconductor device according to the above described first embodiment.

Thus, in accordance with the semiconductor device and manufacturing method for the same according to the present second embodiment, the degree of protrusion of the protruding portions 2m and 2n from the trunk portion 1 is greater than that in the above described first embodiment. Therefore, in comparison with the above described semiconductor device according to the first embodiment, the resistance of the source line SLa can be further reduced.

Third Embodiment

Figure 11:
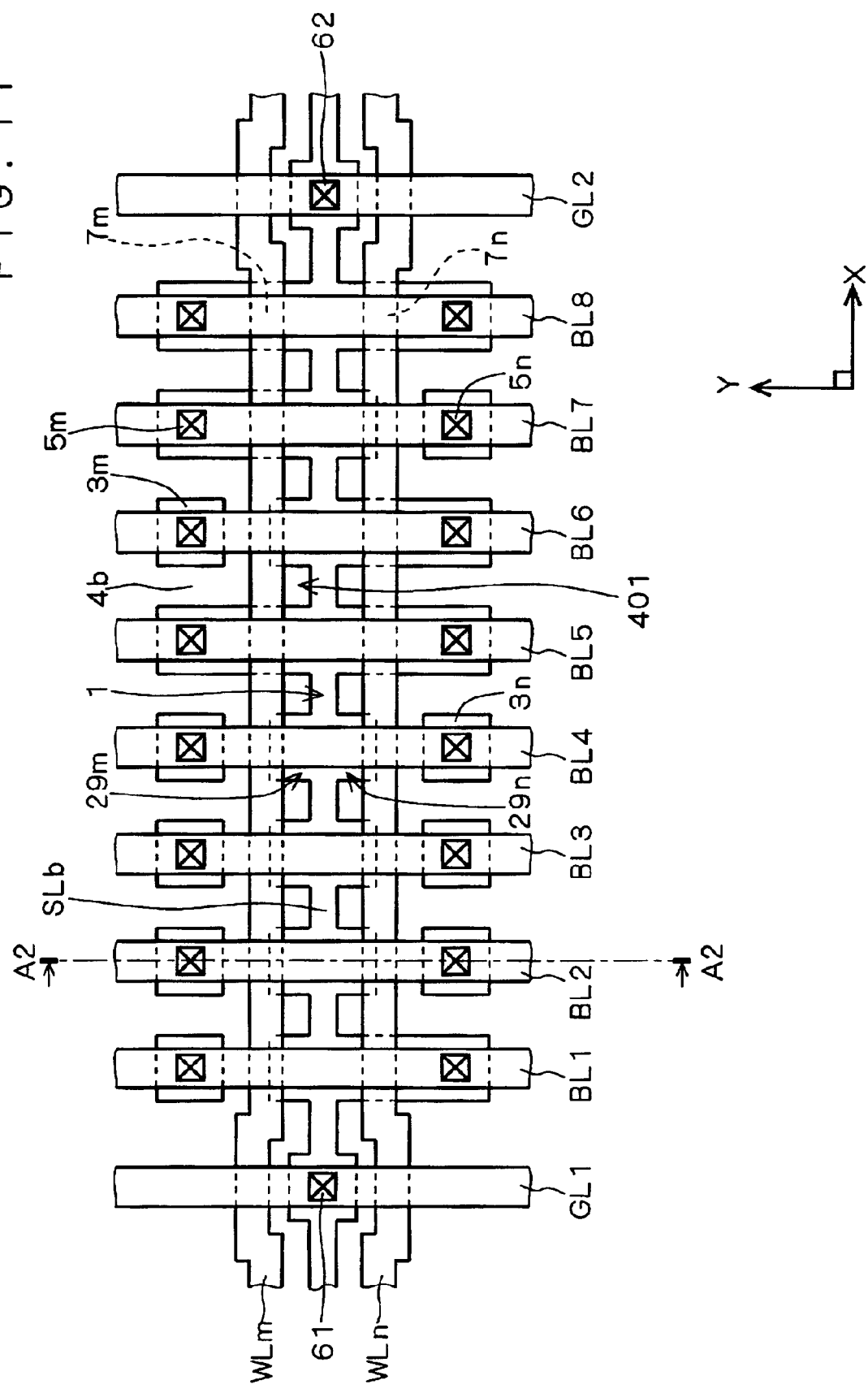
FIG. 11 is a top view showing the structure of a semiconductor device according to a third embodiment of the present invention.

FIG. 11, which corresponds to FIG. 1, is a top view showing the structure of a semiconductor device according to a third embodiment of the present invention. An isolation insulating film 4b and a source line SLb, respectively, are formed in place of the isolation insulating film 4 and the source line SLa shown in FIG. 1. The other parts of the structure as in the structure of the above described semiconductor device according to the first embodiment.

The source line SLb has protruding portions 29m and 29n. The degree of protrusion of the protruding portions 29m and 29n (dimensions of the protruding portions 29m and 29n with respect to the Y direction) from the trunk portion 1 is greater than the degree of protrusion of the protruding portions 2m and 2n from the trunk portion 1. As a result, the isolation insulating film 4b has the dimensions of a protruding portion 401 with respect to the Y direction, which is greater than the dimensions of the protruding portion 400 with respect to the Y direction.

Figure 12:
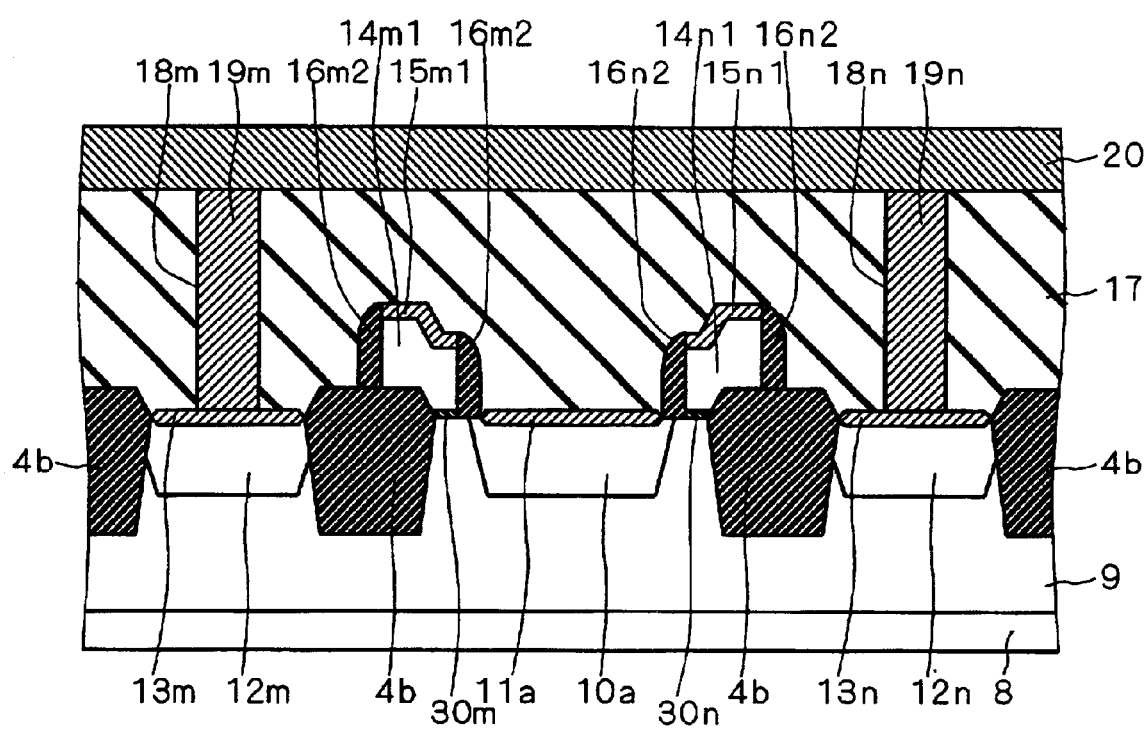
FIG. 12 is a cross sectional view showing the cross sectional structure with respect to the location along ling segment A2—A2 shown in FIG. 11.

FIG. 12 is a cross sectional view showing a cross sectional structure with respect to a location along line segment A2—A2 shown in FIG. 11. The isolation insulating film 4b, polysilicon layers 14m1 and 14n1, cobalt silicide layers 15m1 and 15n1 and sidewalls 16m2 and 16n2 are formed in place of the isolation insulating film 4a, the polysilicon layers 14m and 14n, the cobalt silicide layers 15m and 15n and the sidewalls 16m1 and 16n1, shown in FIG. 10.

The interval between the sides of the isolation insulating film 4b opposed to each other with the $N^+$-type impurity introduced region 10a interposed between them is broader than the interval between the sides of the isolation insulating film 4a opposed to each other with the $N^+$-type impurity introduced region 10a interposed between them. The respective edge portions of the polysilicon layers 14m1 and 14n1 on the cobalt silicide layer 11a side are not formed on the isolation insulating film 4b but, rather, are formed above the top surface of the silicon substrate 8 via gate insulating films 30m and 30n. The sidewalls 16m2 and 16n2 on sides opposed to each other with the cobalt silicide layer 11a interposed between them are not formed on the isolation insulating film 4b but, rather, is formed on the top surface of the silicon substrate 8. Steps are generated on the respective top surfaces of the polysilicon layers 14m1 and 14n1 as well as the cobalt silicide layers 15m1 and 15n1 so that the elevations of the layers on the cobalt silicide layer 11a side are lower than the elevations of the layers on the cobalt silicide layers 13m and 13n sides.

The semiconductor device according to the present the third embodiment can be manufactured by the same method as the above described manufacturing method for a semiconductor device according to the first embodiment by changing the light blocking pattern 25 of the photomask 26 shown in FIG. 9 so as to correspond to the design pattern of the isolation insulating film 4b.

Thus, in accordance with the semiconductor device and the manufacturing method for the same according to the present third embodiment, the following effect can be obtained in addition to the same effects as in the above described second embodiment. That is to say, in accordance with the manufacturing method for a semiconductor device according to the above described first embodiment, there is a possibility that the cobalt film 28 cannot be stably formed on the $N^+$-type impurity introduced region 10 in the step shown in FIG. 7 due to the comparatively great depth of the recess 27 (that is to say, difference in elevation between the top surface of the silicon substrate 8 and the top surface of the polysilicon layers 14m and 14n) shown in FIG. 6. In contrast to this, in accordance with the manufacturing method for a semiconductor device according to the present third embodiment, the difference in elevation between the top surface of the silicon substrate 8 and the top surface of the polysilicon layers 14m1 and 14n1 can be reduced by the difference in elevation between the top surface of the silicon substrate 8 and the top surface of the isolation insulating film 4b. Accordingly, the cobalt film 28 can be formed without fail on the $N^+$-type impurity introduced region 10a in the step corresponding to FIG. 7 and, as a result, the cobalt silicide layer 11a can be stably formed.

Fourth Embodiment

Figure 13:
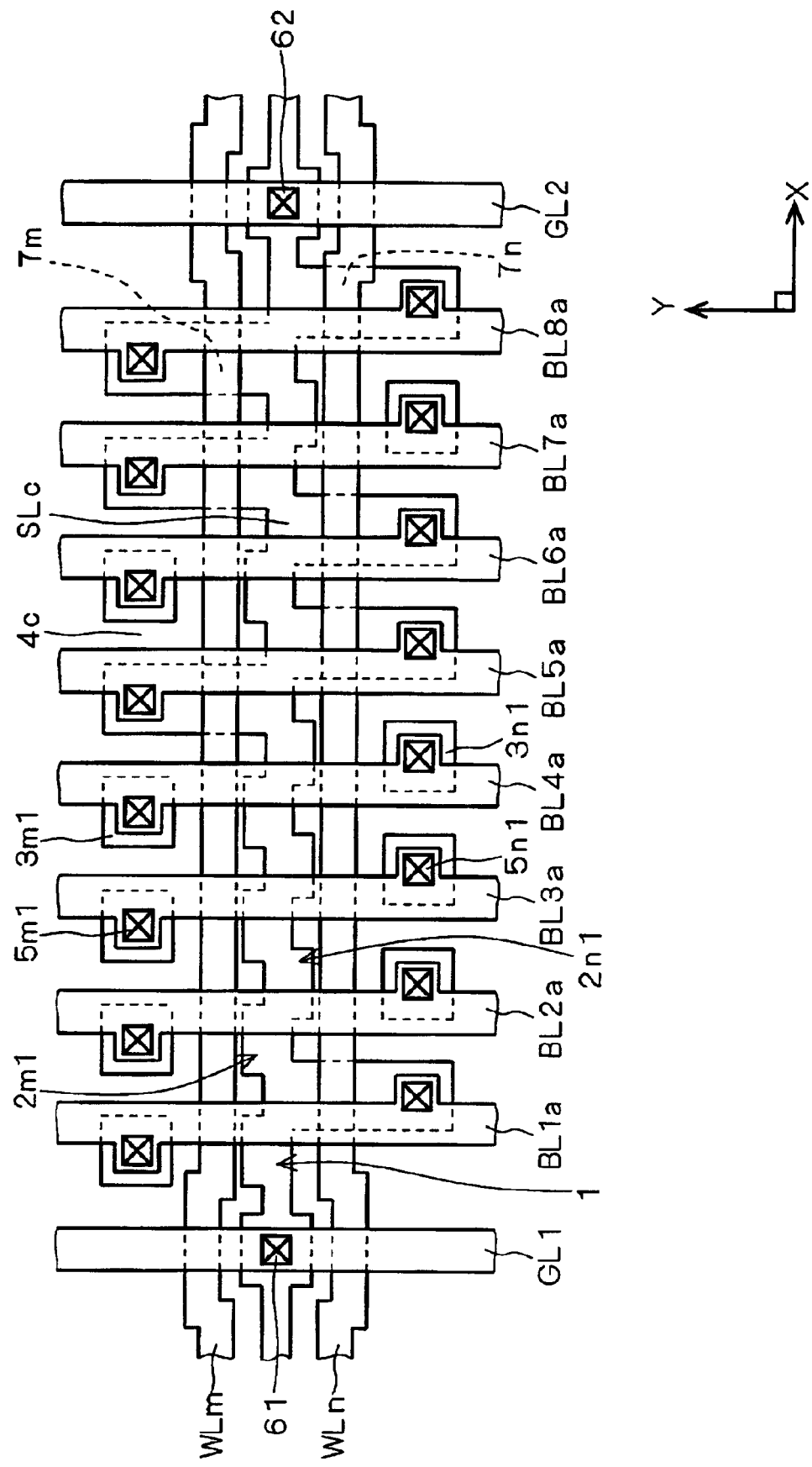
FIG. 13 is a top view showing the structure of a semiconductor device according to a fourth embodiment of the present invention.

FIG. 13, which corresponds to FIG. 1, is a top view showing the structure of a semiconductor device according to a fourth embodiment of the present invention. An isolation insulating film 4c, a source line SLc, drain regions 3m1 and 3n1, bit lines BL1a to BL8a and contact plugs 5m1 and 5n1, respectively, are formed in place of the isolation insulating film 4, the source line SLa, the drain regions 3m and 3n, the bit lines BL1 to BL8 and the contact plugs 5m and 5n, shown in FIG. 1. The other parts of the structure are the same as in the structure of the above described semiconductor device according to the first embodiment.

In the above described semiconductor device according to the first embodiment, as shown in FIG. 1, the protruding portion 2m and the protruding portion 2n are not shifted from each other with respect to the X direction while neither the protruding portion 2m nor the protruding portion 2n is formed in the source line SLa and, thereby, a portion consisting of only the trunk portion 1 exists. In such a portion of narrow width consisting of only the trunk portion 1, there is a possibility, as described above, of the value of the source resistance becoming great wherein the cobalt silicide layer 11 is not stably formed.

In contrast to this, in the semiconductor device according to the present fourth embodiment, as shown in FIG. 13, the protruding portion 2m1 and the protruding portion 2n1 are shifted from each other with respect to the X direction so as to be formed in an alternating manner. In particular, in a an example shown in FIG. 13, the protruding portion 2n1 is formed so as to shifted in the X direction relative to the protruding portion 2m1 by the distance corresponding to half the formation pitch of the protruding portion 2m1. Thereby, the protruding portion 2m1 or a connection region between the trunk portion 1 and the channel formation region 7m is formed on the side opposite to a portion in the source line SLc wherein there is no formation of a protruding portion 2n1 and a connection region between the trunk portion 1 and the channel formation region 7n.

The drain regions 3m1 and 3n1 are formed so as to shift from each other with respect to the X direction corresponding to the shift between the protruding portion 2m1 and the protruding portion 2n1. The drain region 3m1 is connected to a bit line from among bit lines BL1a to BL8a via the contact plug 5m1 while the drain region 3n1 is connected to a bit line from among bit lines BL1a to BL8a via the contact plug 5n1.

Here, in the case that the interval between bit lines adjoining each other becomes less than the width permitted by the design rule, the degree of shift between the protruding portion 2m1 and the protruding portion 2n1 may be reduced.

The semiconductor device according to the present fourth embodiment can be manufactured by the same method as the above described manufacturing method for a semiconductor device according to the first embodiment by modifying the light blocking pattern 25 of the photomask 26, shown in FIG. 9, so as to correspond to the design pattern of the isolation insulating film 4c.

Figure 14:
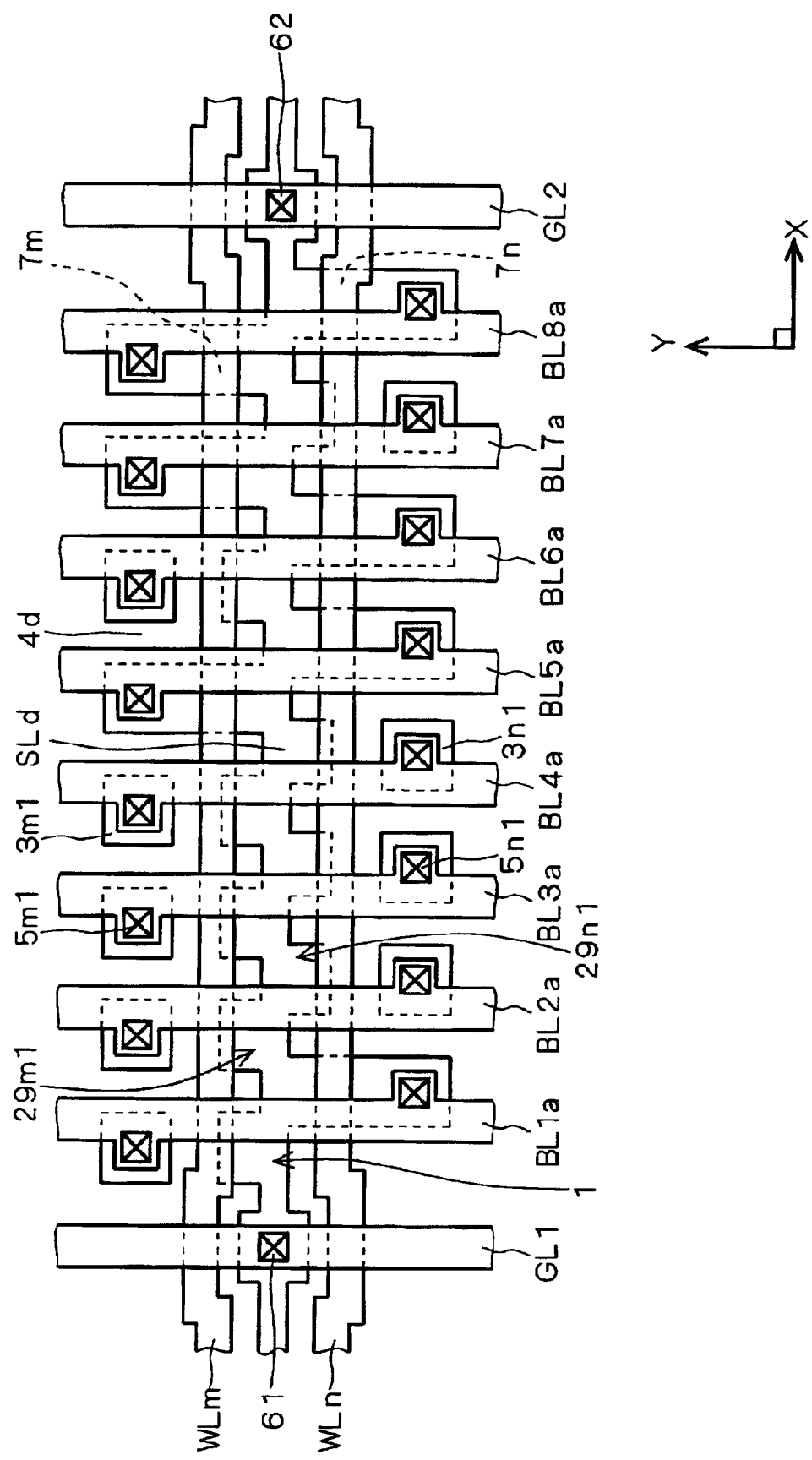
FIG. 14 is a top view showing the structure of a semiconductor device according to a modified example of the fourth embodiment of the present invention.

FIG. 14, which corresponds to FIG. 13, is a top view showing the structure of a semiconductor device according to a modified embodiment of the fourth embodiment of the present invention. An example to which the invention according to the present fourth embodiment is applied based on the above described first embodiment is described in reference to FIG. 13 and, as shown in FIG. 14, the invention according to the present fourth embodiment may be applied as based on the above described third embodiment. In FIG. 14, a source line SLd has protruding portions 29m1 and 29n1 formed so as to be shifted from each other with respect to the X direction. The invention according to the present fourth embodiment can also, of course, be applied as based on the above described second embodiment.

Thus, in accordance with the semiconductor device and manufacturing method for the same according to the present fourth embodiment, the protruding portion 2m1 and the protruding portion 2n1 are formed so as to be shifted from each other with respect to the X direction and, thereby, a portion having a narrow width comprised of only the trunk portion 1 does not exist in the source line SLc. Therefore, the state wherein the value of the source resistance becomes great in the portion having a narrow width or the state wherein the cobalt silicide layer 11 is not stably formed in the portion having a narrow width can be avoided.

Fifth Embodiment

Figure 15:
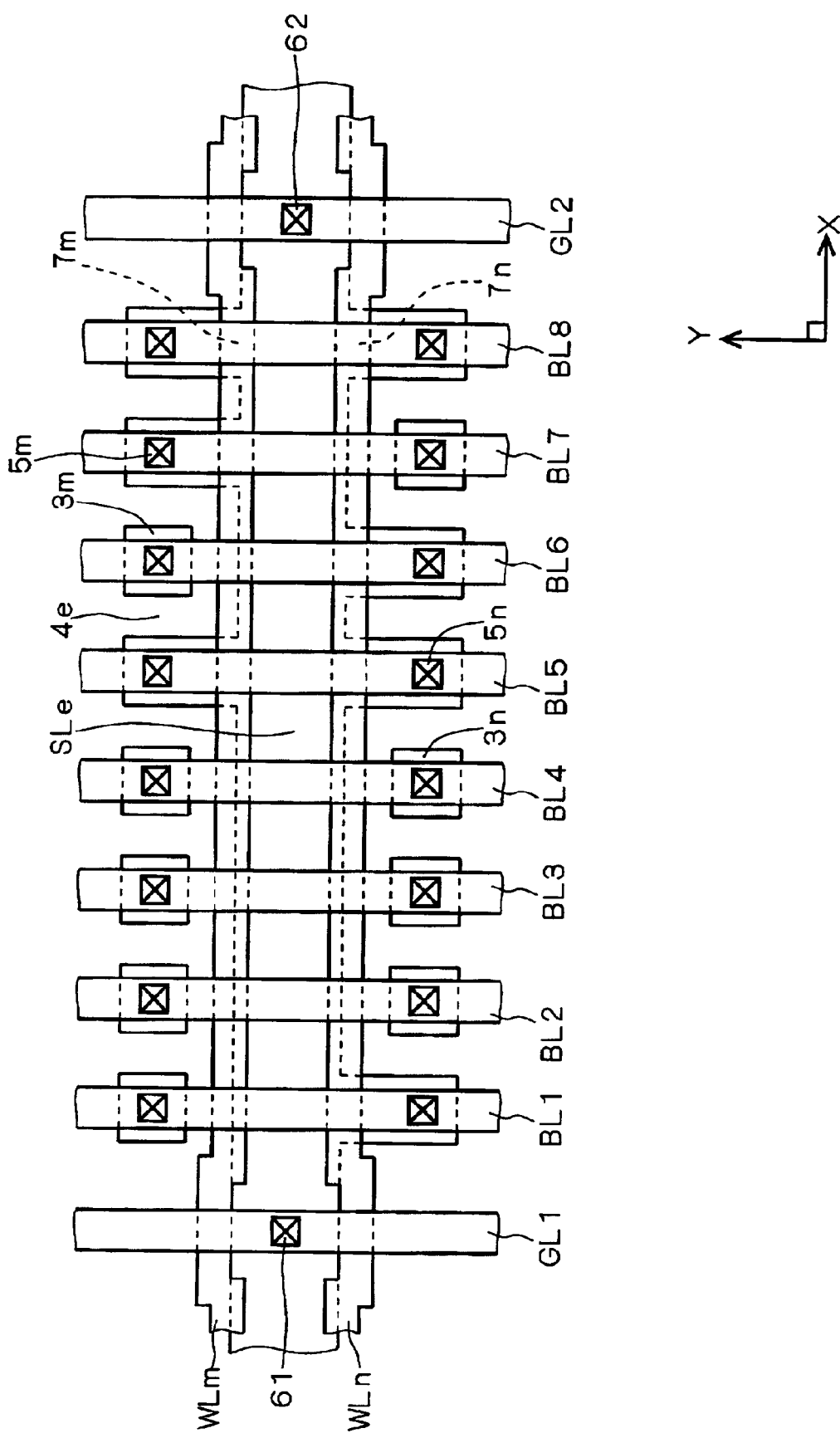
FIG. 15 is a top view showing the structure of a semiconductor device according to a fifth embodiment of the present invention.

FIG. 15, which corresponds to FIG. 11 with respect to the third embodiment, is a top view showing the structure of a semiconductor device according to a fifth embodiment of the present invention. An isolation insulating film 4e and a source line SLe, respectively, are formed in place of the isolation insulating film 4b and the source line SLb shown in FIG. 11. The other parts of the structure are the same as in the structure of the above described semiconductor device according to the third embodiment.

The isolation insulating film 4e is obtained by eliminating the protruding portion 401 from the isolation insulating film 4b. As a result, in the present fifth embodiment, the word lines WLm and WLn and the source line SLe are mutually overlapped in the plan view, not only in regions within memory cells but, also, in regions between memory cells adjoining each other in the X direction.

The semiconductor device according to the present fifth embodiment can be manufactured by the same method as the above described manufacturing method for a semiconductor device according to the first embodiment by modifying the light blocking pattern 25 of the photomask 26 shown in FIG. 9 so as to correspond to the design pattern of the isolation insulating film 4e.

Figure 16:
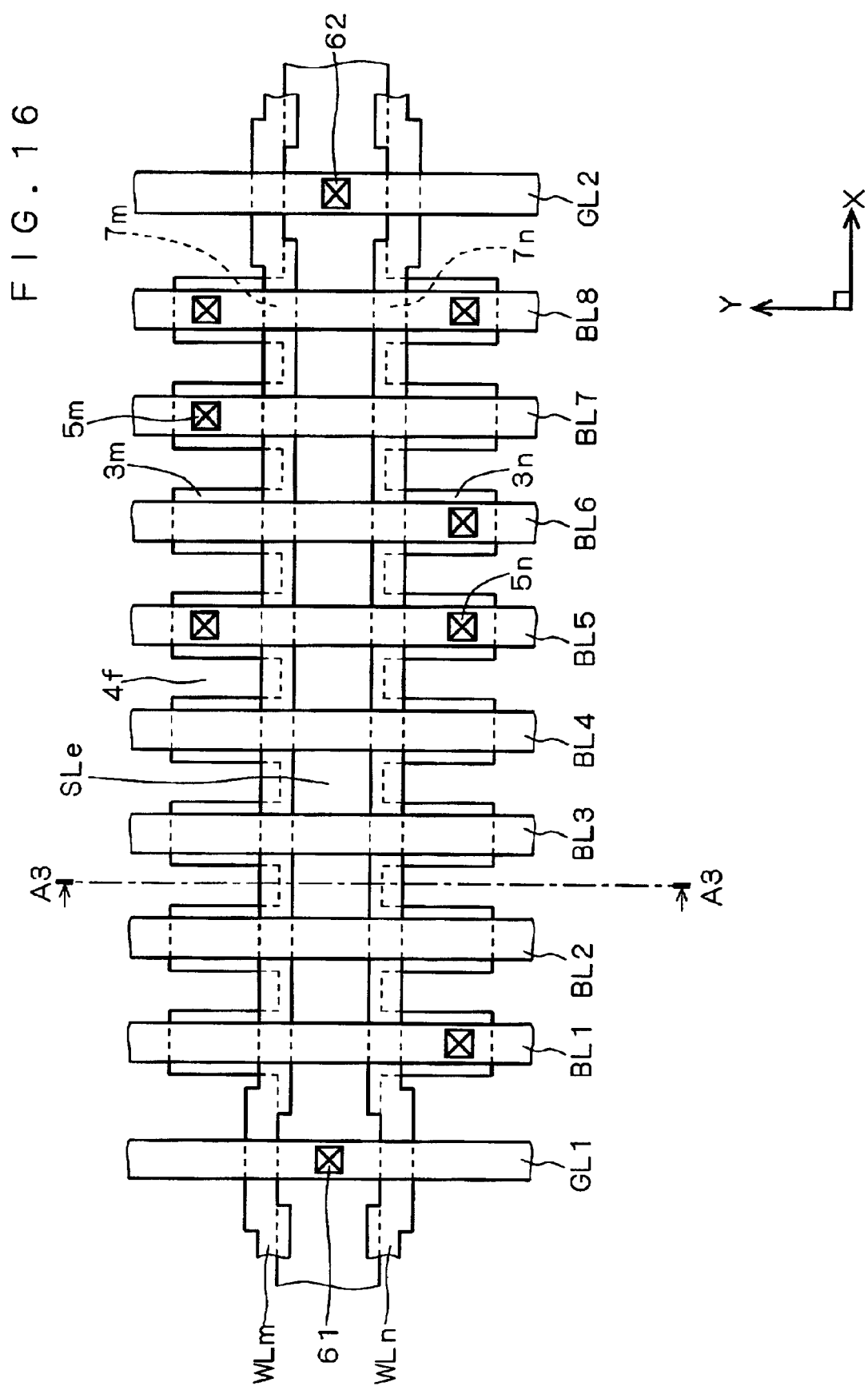
FIG. 16 is a top view showing the structure of a semiconductor device according to a modified example of the fifth embodiment of the present invention.
Figure 17:
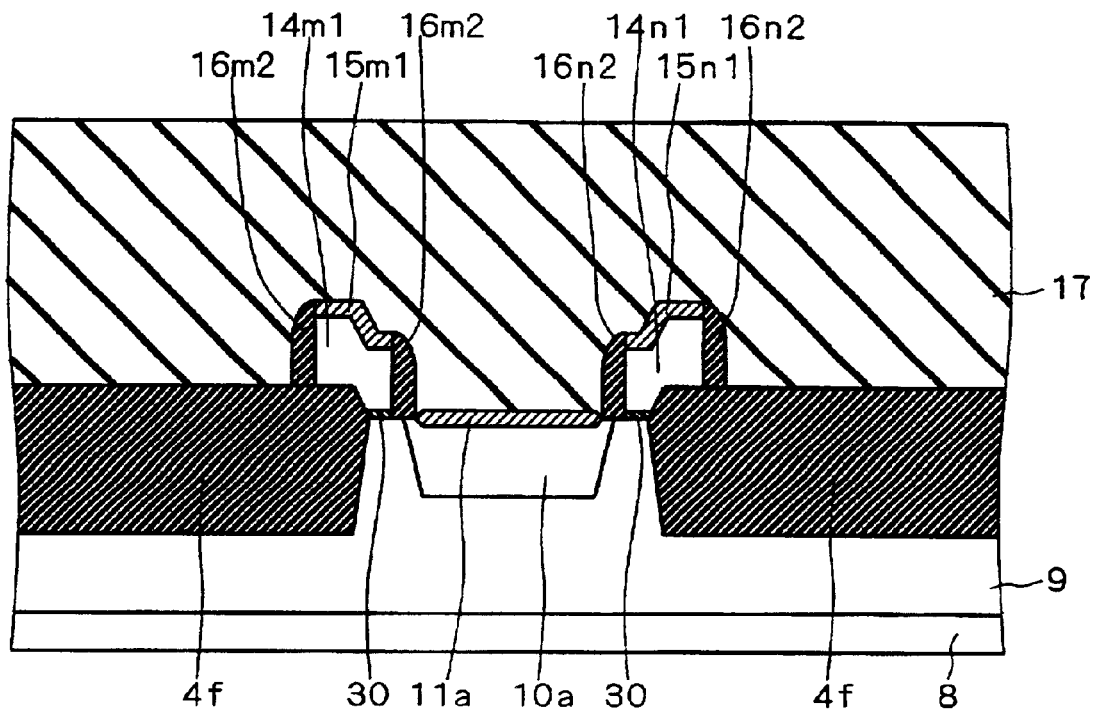
FIG. 17 is a cross sectional view showing the cross sectional structure with respect to the location along ling segment A3—A3 shown in FIG. 16.

FIG. 16, which corresponds to FIG. 15, is a top view showing the structure of a semiconductor device according to a modified embodiment of the fifth embodiment of the present invention. In addition, FIG. 17 is a cross sectional view showing the cross sectional structure with respect to the location along line segment A3—A3 shown in FIG. 16. Though FIG. 15 shows the structure of a memory cell array of a mask ROM of the type wherein programming is carried out according to a pattern of the isolation insulating film 4e, the invention according to the present fifth embodiment can be applied to a mask ROM as an object, wherein programming is carried out according to whether or not the contact plug 5m or 5n is formed, as shown in FIGS. 16 and 17.

The semiconductor device shown in FIGS. 16 and 17 is provided with an isolation insulating film 4f in place of the isolation insulating film 4e. All drain regions 3m and 3n are connected to the source line SLe via the channel formation regions 7m and 7n.

Thus, in accordance with the semiconductor device and manufacturing method for the same according to the present fifth embodiment, the word lines WLm and WLn and the source line SLe are mutually overlapped in the plan view in regions between memory cells adjoining each other in the X direction. Therefore, the same effects as in the above described third embodiment can be obtained with respect to these regions.

Sixth Embodiment

Figure 18:
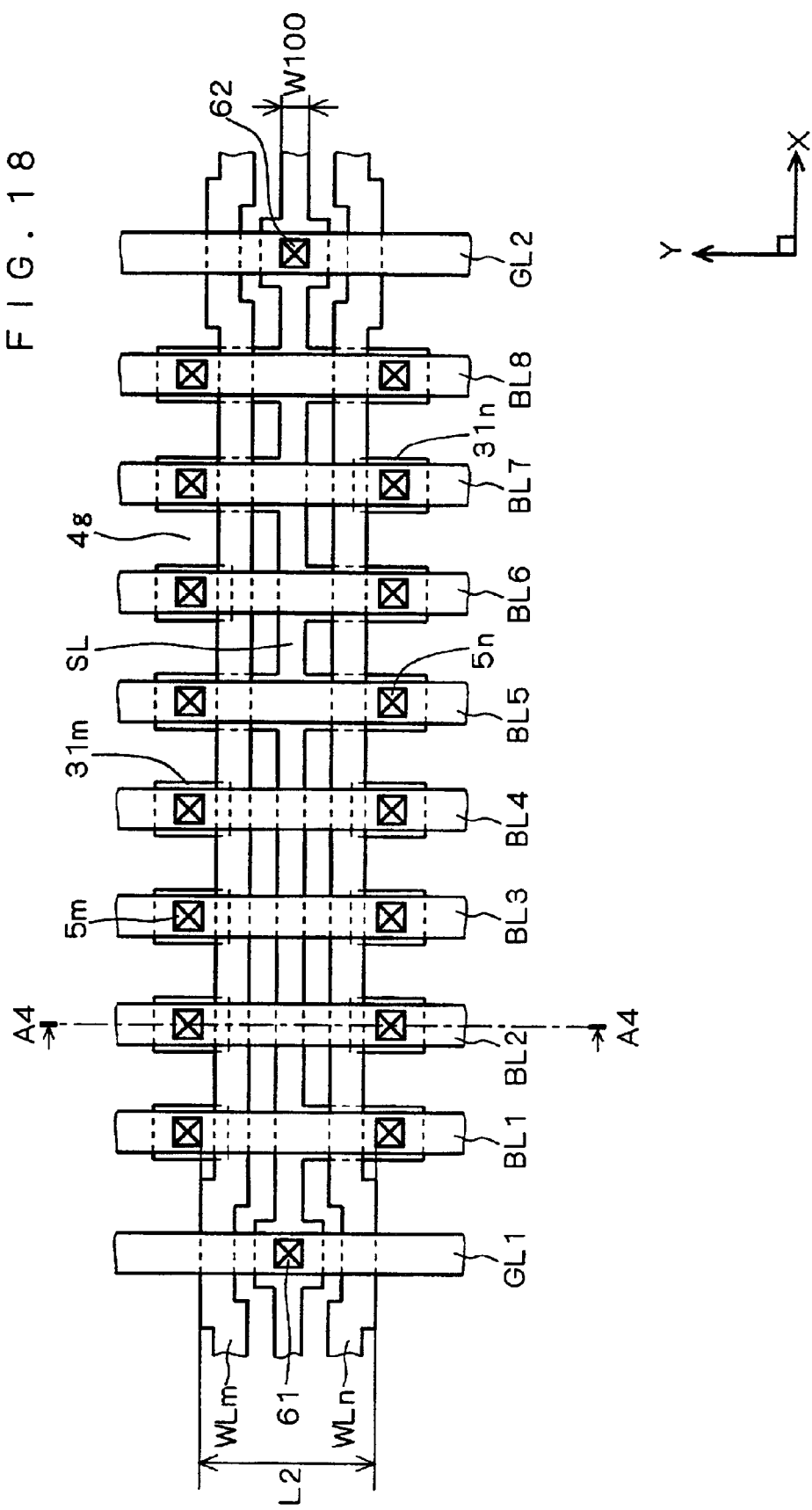
FIG. 18 is a top view showing the structure of a semiconductor device according to a sixth embodiment of the present invention.

FIG. 18, which corresponds to FIG. 24 with respect to the background art, is a top view showing the structure of a semiconductor device according to a sixth embodiment of the present invention. An isolation insulating film 4g and drain regions 31m and 31n, respectively, are formed in place of the isolation insulating film 104 and the drain regions 3m and 3n shown in FIG. 24. The other parts of the structure are the same as in the structure of the semiconductor device according to the prior art.

Each of the drain regions 31m and the word line WLm are, partially, mutually overlapped in the plan view with respect to five memory cells corresponding to "1" of the ROM code from among eight memory cells belonging to the m-th row. In the same manner, each of the drain regions 31n and the word line WLn are, partially, mutually overlapped in the plan view with respect to four memory cells corresponding to "1" of the ROM code from among eight memory cells belonging to the n-th row. The interval L2 between the contact plugs 5m and 5n belonging to the same column is narrower than the interval L1 shown in FIG. 24.

Figure 19:
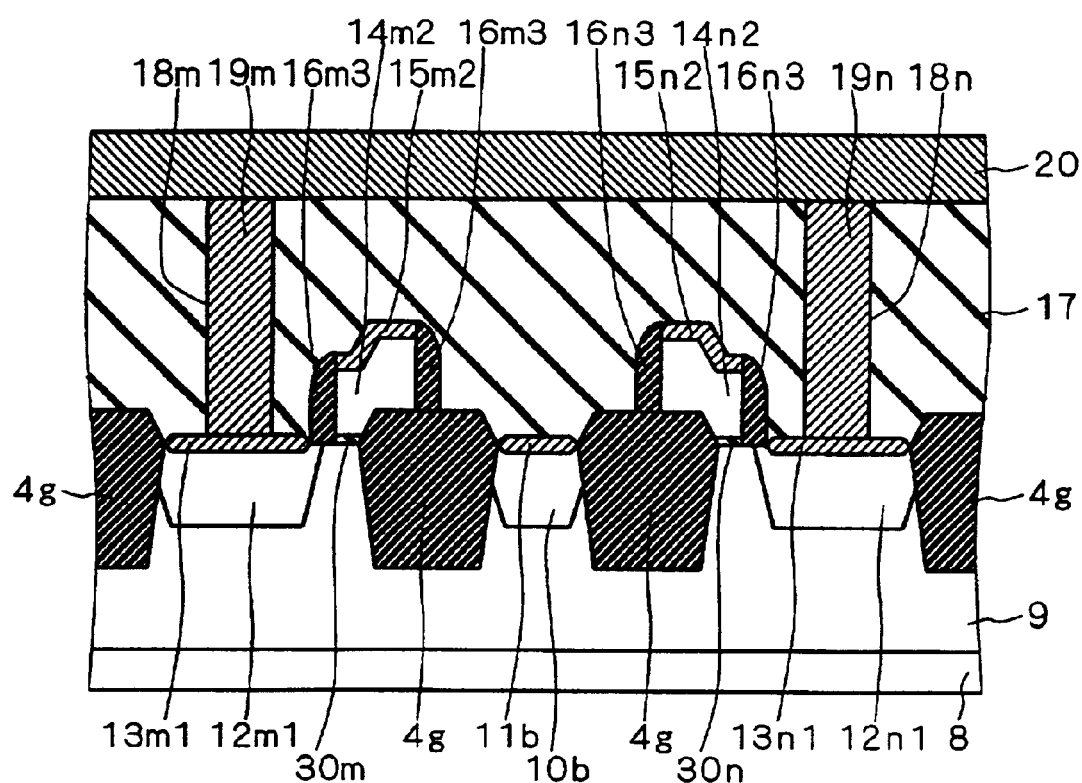
FIG. 19 is a cross sectional view showing the cross sectional structure with respect to the location along ling segment A4—A4 shown in FIG. 18.

FIG. 19 is a cross sectional view showing the cross sectional structure with respect to the location along line segment A4—A4 shown in FIG. 18. The edge portion of the polysilicon layer 14m2 on the cobalt silicide layer 13m1 side is not formed on the isolation insulating film 4g but, rather, is formed above the top surface of the silicon substrate 8 via a gate insulating film 30m. In the same manner, the edge portion of the polysilicon layer 14n2 on the cobalt silicide layer 13n1 side is not formed on the isolation insulating film 4g but, rather, is formed above the top surface of the silicon substrate 8 via a gate insulating film 30n. In addition, a sidewall 16m3 on the cobalt silicide layer 13m1 side is not formed on the isolation insulating film 4g but, rather, is formed on the top surface of the silicon substrate 8. In the same manner, a sidewall 16n3 on the cobalt silicide layer 13n1 side is not formed on the isolation insulating film 4g but, rather, is formed on the top surface of the silicon substrate 8. Steps are generated on the respective top surfaces of the polysilicon layers 14m2 and 14n2 as well as the cobalt silicide layers 15m2 and 15n2 so that the portions of the layers on the cobalt silicide layer 13m1 and 13n1 sides are lower than the portions of the layers on the cobalt silicide layer 11b side. The width of the cobalt silicide layer 13m1 and the N$^+$-type impurity introduced region 12m1 is narrower than the width of the cobalt silicide layer 13m and the N$^+$-type impurity introduced region 12m. In the same manner, the width of the cobalt silicide layer 13n1 and the N$^+$-type impurity introduced region 12n1 is narrower than the width of the cobalt silicide layer 13n and the N$^+$-type impurity introduced region 12n.

The semiconductor device according to the present sixth embodiment can be manufactured by the same method as the above described manufacturing method for a semiconductor device according to the first embodiment by modifying the light blocking pattern 25 of the photomask 26 shown in FIG. 9 so as to correspond to the design pattern of the isolation insulating film 4g.

Thus, in accordance with the semiconductor device and manufacturing method for the same according to the present sixth embodiment, the difference in elevation between the top surface of the silicon substrate 8 and the top surface of the polysilicon layers 14m2 and 14n2 can be reduced by the difference in elevation between the top surface of the silicon substrate 8 and the top surface of the isolation insulating film 4g with respect to the drain regions 31m and 31n. Accordingly, in the step corresponding to FIG. 7, the cobalt film 28 can be formed without fail on the N$^+$-type impurity introduced regions 12m1 and 12n1 and, as a result, the cobalt silicide layers 13m1 and 13n1 can be stably formed.

In addition, the interval L2 between the contact plugs 5m and 5n becomes narrower in comparison with the background art and, thereby, the structure is miniaturized to a greater degree than in the background art. Moreover, the areas of the drain regions 31m and 31n can be reduced due to the stable formations of the cobalt silicide layers 13m1 and 13n1 and, therefore, further miniaturization of the structure can be achieved.

Figure 20:
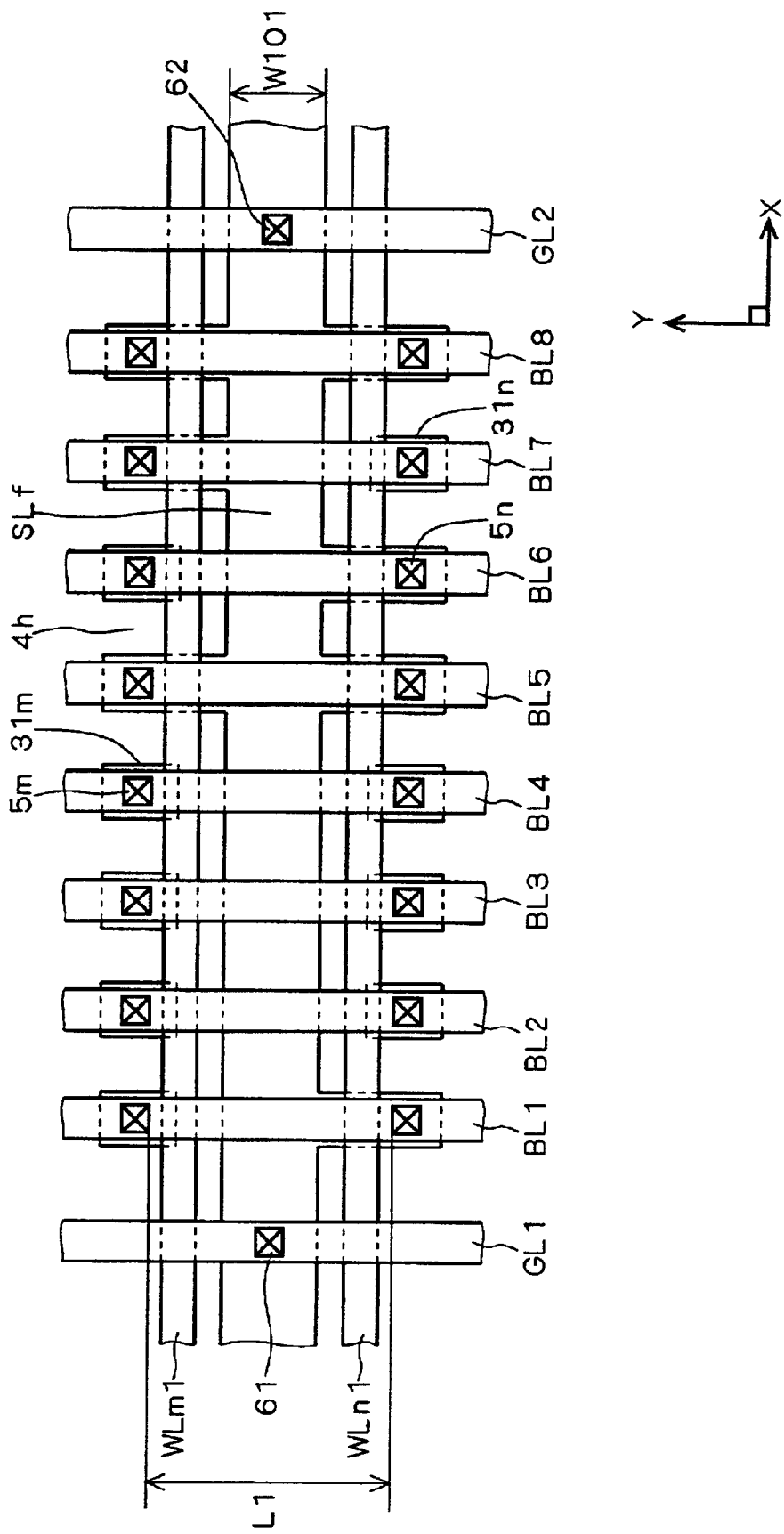
FIG. 20 is a top view showing the structure of a semiconductor device according to a modified embodiment of the sixth embodiment of the present invention.

FIG. 20, which corresponds to FIG. 19, is a top view showing the structure of a semiconductor device according to a modified embodiment of the sixth embodiment of the present invention. Instead of achieving the miniaturization of the structure by making the interval between the contact plugs 5m and 5n narrower than in the background art, the width W101 of a source line SLf is made broader than the width W100 of the background art while maintaining the interval between the contact plugs 5m and 5n as L1 in the same manner as in the background art. Together with this, the interval between word lines WLm1 and WLn1 is made broader than in the background art. In accordance with the semiconductor device according to the modified example of the present sixth embodiment, reduction of the source resistance can be achieved while maintaining a level of integrity similar to that of the semiconductor device according to the background art.

Now, in the above description of first to sixth embodiments, other metal silicide layers, such as titanium silicide layers, may be formed in place of the cobalt silicide layers. In addition, though the memory cells wherein the memory cell transistors are formed correspond to "0" of the ROM code while the memory cells wherein the memory cell transistors are not formed correspond to "1" of the ROM code in the description, the reverse of these is possible.

In addition, though memory cell arrays of a small scale of the two row by eight column configuration are described, the number of rows or columns is not limited to the numbers in these examples. The greater the number of columns placed between two ground lines GL1 and GL2, the greater the effects of the present invention become. This is because the source resistance becomes greater together with the increase with the length of the source line. In addition, this is because the current that flows through the source line becomes greater at the time of the data read out operation and, therefore, the voltage drop according to the product of the on current of a memory cell transistor and the resistance value of the source register increases.

Figure 21:
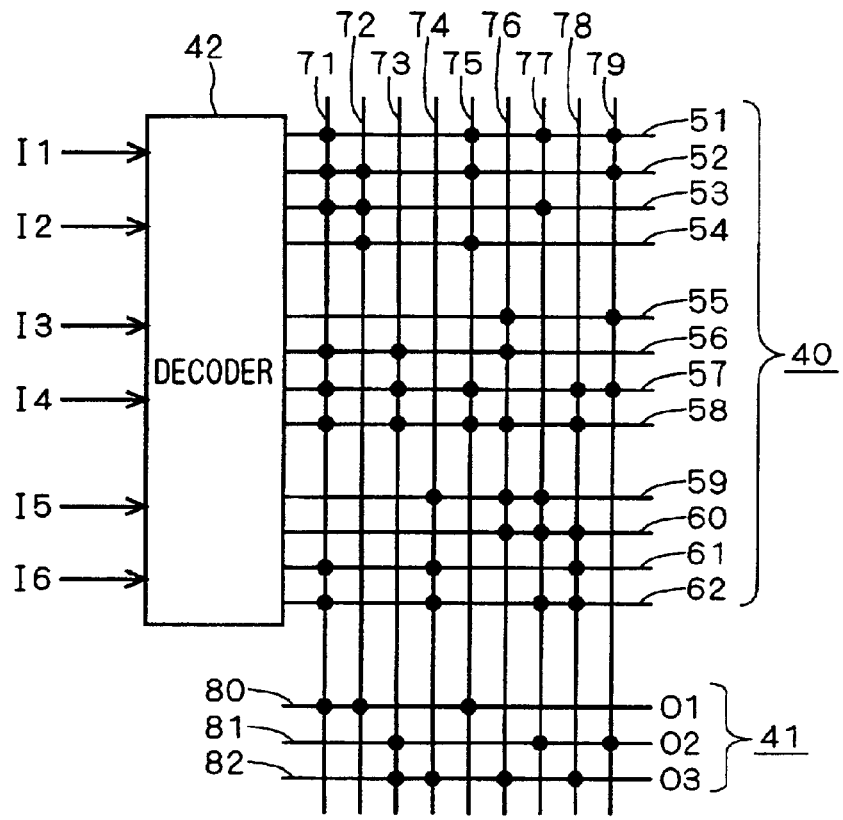
FIG. 21 is a block diagram showing the configuration of a PLA.

In addition, though the first to sixth embodiments, respectively, of the present invention are described above by citing examples of structures of mask ROMs and manufacturing methods for the same, the present invention can be applied to a semiconductor device other than a mask ROM. FIG. 21 is a block diagram showing a structure of a PLA (programmable logic array). The PLA is provided with an AND array 40 and an OR array 41. Input lines 51 to 62 and product term lines 71 to 79 intersect in AND array 40 while and product term lines 71 to 79 and output lines 80 to 82 intersect in OR array 41.

Figure 22:
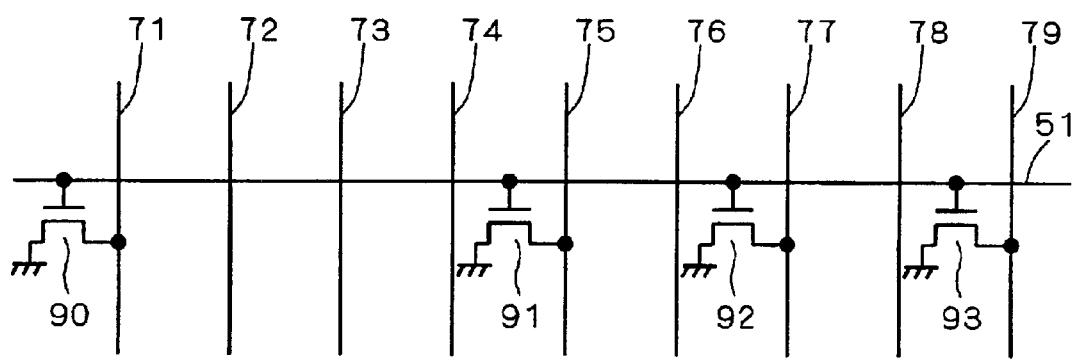
FIG. 22 is a diagram showing the configuration of intersection portions between an input line and a plurality of product term lines.
Figure 23:
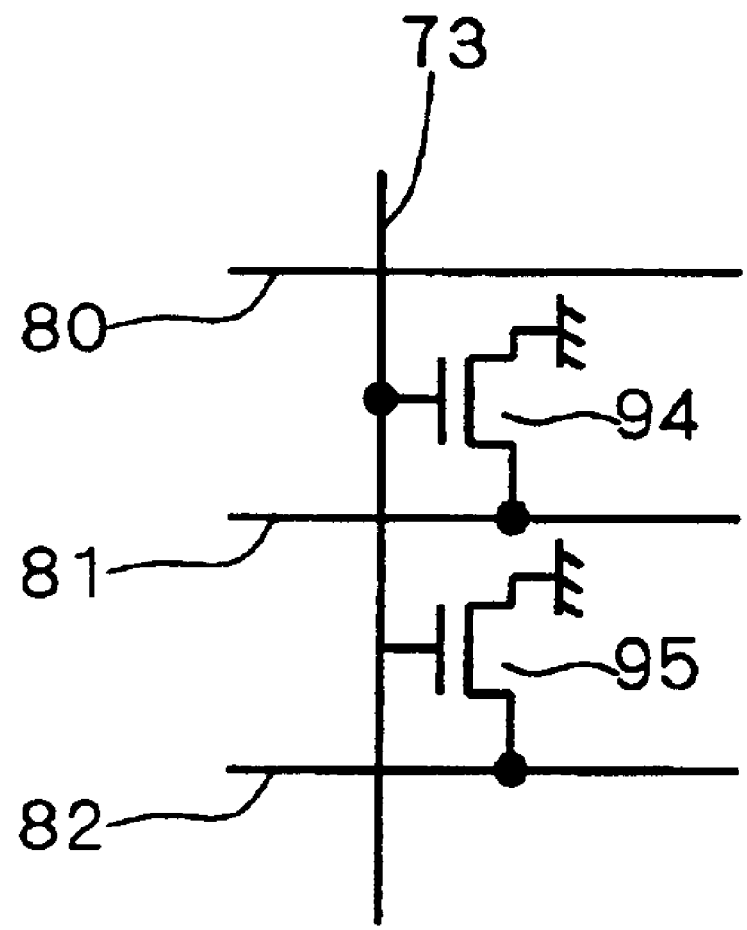
FIG. 23 is a diagram showing the configuration of intersection portions between a product term line and a plurality of output lines.

FIG. 22 is a diagram showing a configuration of an intersection portion between the input line 51 and the product term lines 71 to 79. The input line 51 is connected to the product term lines 71, 75, 77 and 79, respectively, by means of transistors 90 to 93. FIG. 23 is a diagram showing a configuration on an intersection portion of the output lines 80 to 81 and the product term line 73. The product term line 73 is connected to the output lines 81 and 82, respectively, by means of transistors 94 and 95.

Thus, a desired logic is implemented in a PLA depending on whether or not a transistor is formed in each of the intersection portions between the input lines 51 to 62 and the product term lines 71 to 79 as well as whether or not a transistor is formed in each of the intersection portions between the product term lines 71 to 79 and the output lines 80 to 82. Whether or not a transistor is formed is determined by the formation pattern of an isolation insulating film and, therefore, the present invention can be applied to a PLA.

In addition, the present invention can be applied to any semiconductor device as long as a plurality of transistors is formed along a shared wire formed of an active region in an elongated form without being limited to a mask ROM or a PLA.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a plurality of first impurity introduced regions isolated from each other by an isolation insulating film and aligned in a predetermined direction;
   a second impurity introduced region extending in said predetermined direction and located at a distance away from said plurality of first impurity introduced regions; and
   a first control electrode extending in said predetermined direction between said plurality of first impurity introduced regions and said second impurity introduced region, wherein
   whether a first transistor is not, or is, formed is selected for each cell depending on whether said isolation insulating film is formed or a first semiconductor region is formed due to the absence of formation of said isolation insulating film between said first impurity introduced regions and said second impurity introduced region,
   a first protruding portion that protrudes towards one of said first impurity introduced regions is formed in said second impurity introduced region in a cell, in which said first transistor is not formed, from among a plurality of cells having said first impurity introduced regions, and
   said plurality of first impurity introduced regions are isolated for each cell by said isolation insulating film.

2. The semiconductor device according to claim 1, further comprising:
   a semiconductor substrate having a main surface in which said isolation insulating film and said second impurity introduced region are formed; and
   a metal-semiconductor compound layer formed on said main surface in a portion in which said second impurity introduced region is formed, wherein
   an edge portion of said first control electrode on said first impurity introduced region side is formed on said isolation insulating film while an edge portion of said first control electrode on said second impurity introduced region side is formed above said main surface in a cell, in which said first transistor is not formed, from among said plurality of cells.

3. The semiconductor device according to claim 1, further comprising:
   a plurality of third impurity introduced regions isolated from each other by said isolation insulating film and aligned in said predetermined direction at a distance away from said second impurity introduced region on the side opposite to said plurality of first impurity introduced regions; and
   a second control electrode extending in said predetermined direction between said plurality of third impurity introduced regions and said second impurity introduced region,
   wherein whether a second transistor is not, or is, formed is selected for each cell depending on whether said isolation insulating film is formed or a second semiconductor region is formed due to the absence of the formation of said isolation insulating film between said third impurity introduced regions and said second impurity introduced region;
   a second protruding portion that protrudes towards one of said third impurity introduced regions is formed in said second impurity introduced region in a cell, in which said second transistor is not formed, from among a plurality of cells having said third impurity introduced regions; and said first protruding portion and said second protruding portion are shifted from each other with respect to said predetermined direction.

4. The semiconductor device according to claim 3, wherein said first protruding portion or said first semiconductor region is formed in said second impurity introduced region on said first impurity introduced regions side in a portion wherein neither said second protruding portion or said second semiconductor region is formed on said third impurity introduced regions side.

5. The semiconductor device according to claim 3, wherein a plurality of protruding portions of the same type as said second protruding portion are formed, and wherein said first protruding portion is shifted from said second protruding portion with respect to said predetermined direction by a distance corresponding to a half of the formation pitch between said plurality of second protruding portions.

6. The semiconductor device according to claim 3, further comprising:

a semiconductor substrate having a main surface wherein said isolation insulating film and said second impurity introduced region are formed; and a metal-semiconductor compound layer formed on said main surface in a portion wherein said second impurity introduced region is formed, wherein an edge portion of said first control electrode on said first impurity introduced region side is formed on said isolation insulating film while an edge portion of said first control electrode on said second impurity introduced region side is formed above said main surface in a cell, wherein said first transistor is not formed, from among a plurality of cells having said first impurity introduced regions, and wherein an edge portion on said third impurity introduced region side of said second control electrode is formed on said isolation insulating film while an edge portion on said second impurity introduced region side of said second control electrode is formed above said main surface in a cell, wherein said second transistor is not formed, from among a plurality of cells having said third impurity introduced regions.

7. The semiconductor device according to claim 1, which is applied to a mask ROM of a type wherein programming is carried out according to a formation pattern of an isolation insulating film.

8. The semiconductor device according to claim 1, which is applied to a PLA wherein a desired logic is implemented according to a formation pattern of an isolation insulating film.

9. A semiconductor device comprising:

a plurality of first impurity introduced regions isolated from each other by an isolation insulating film and aligned in a predetermined direction;

a second impurity introduced region extending in said predetermined direction and located at a distance away from said plurality of first impurity introduced regions;

a control electrode extending in said predetermined direction between said plurality of first impurity introduced regions and said second impurity introduced region;

a semiconductor substrate having a main surface wherein said isolation insulating film and said second impurity introduced region are formed; and a metal-semiconductor compound layer formed on said main surface in a portion wherein said second impurity introduced region is formed, wherein an edge portion of said control electrode on said first impurity introduced regions side is formed on said isolation insulating film and an edge portion of said control electrode on said second impurity introduced region side is formed above said main surface in a region between cells adjoining each other.

10. The semiconductor device according to claim 9, which is applied to a mask ROM of a type wherein programming is carried out according to a formation pattern of an isolation insulating film.

11. The semiconductor device according to claim 9, which is applied to a PLA wherein a desired logic is implemented according to a formation pattern of an isolation insulating film.

12. The semiconductor device according to claim 9, which is applied to a mask ROM of a type wherein programming is carried out according to whether, or not, a contact plug is formed.

* * * * *